(12) United States Patent
Ito et al.

(10) Patent No.: US 10,121,829 B2
(45) Date of Patent: Nov. 6, 2018

(54) DISPLAY ELEMENT, DISPLAY DEVICE, AND MANUFACTURING METHOD OF THE DISPLAY DEVICE

(71) Applicant: Japan Display Inc., Tokyo (JP)

(72) Inventors: Masato Ito, Tokyo (JP); Shigeru Sakamoto, Tokyo (JP); Koji Yasukawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/816,246

(22) Filed: Nov. 17, 2017

(65) Prior Publication Data

US 2018/0182823 A1 Jun. 28, 2018

(30) Foreign Application Priority Data

Dec. 22, 2016 (JP) .................................. 2016-249226

(51) Int. Cl.
*H01L 51/52* (2006.01)
*H01L 27/32* (2006.01)
*H01L 51/50* (2006.01)
*H01L 33/08* (2010.01)

(52) U.S. Cl.
CPC ...... *H01L 27/3206* (2013.01); *H01L 51/5012* (2013.01); *H01L 51/5036* (2013.01); *H01L 51/5056* (2013.01); *H01L 51/5237* (2013.01); *H01L 51/5253* (2013.01); *H01L 51/5256* (2013.01); *H01L 51/5265* (2013.01); *H01L 27/3244* (2013.01); *H01L 33/08* (2013.01); *H01L 2227/323* (2013.01); *H01L 2251/558* (2013.01)

(58) Field of Classification Search
None
See application file for complete search history.

(56) References Cited

U.S. PATENT DOCUMENTS 8,680,543 B2 * 3/2014 Takeda ............... H01L 51/5265
257/40
9,202,848 B2 * 12/2015 Kim .................... H01L 27/3211
9,548,339 B2 * 1/2017 Jeong ................... H01L 27/322

FOREIGN PATENT DOCUMENTS

JP 2006-302878 A 11/2006
JP 2006-302879 A 11/2006

* cited by examiner

*Primary Examiner* — Minh-Loan Tran
(74) *Attorney, Agent, or Firm* — Typha IP LLC

(57) ABSTRACT

Provided is a display device including first to third pixels and first to fourth cap layers. The first cap layer is located over and overlaps with the first to third light-emitting elements and extends from the first pixel to the third pixel through the second pixel. The second and third cap layers are located over the first cap layer and respectively overlap with the second and third light-emitting elements. The fourth cap layer is located over the first to fourth cap layers. The first to third pixels are arranged in this order. The first to third light-emitting elements are configured so that an emission wavelength of the second light-emitting element is shorter than an emission wavelength of the third light-emitting element and longer than an emission wavelength of the first light-emitting element. A thickness of the third cap layer is larger than a thickness of the second cap layer.

20 Claims, 19 Drawing Sheets

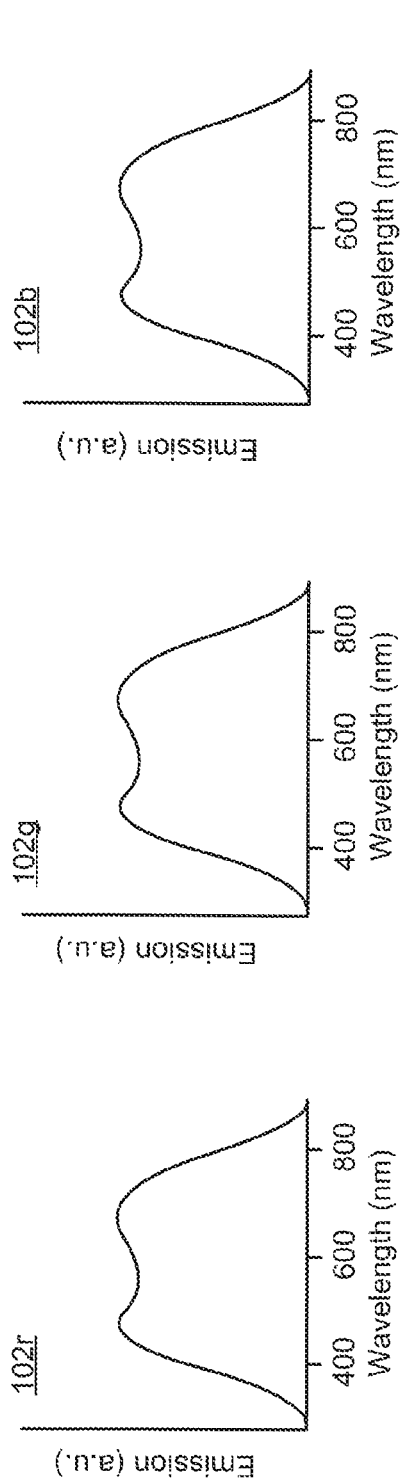
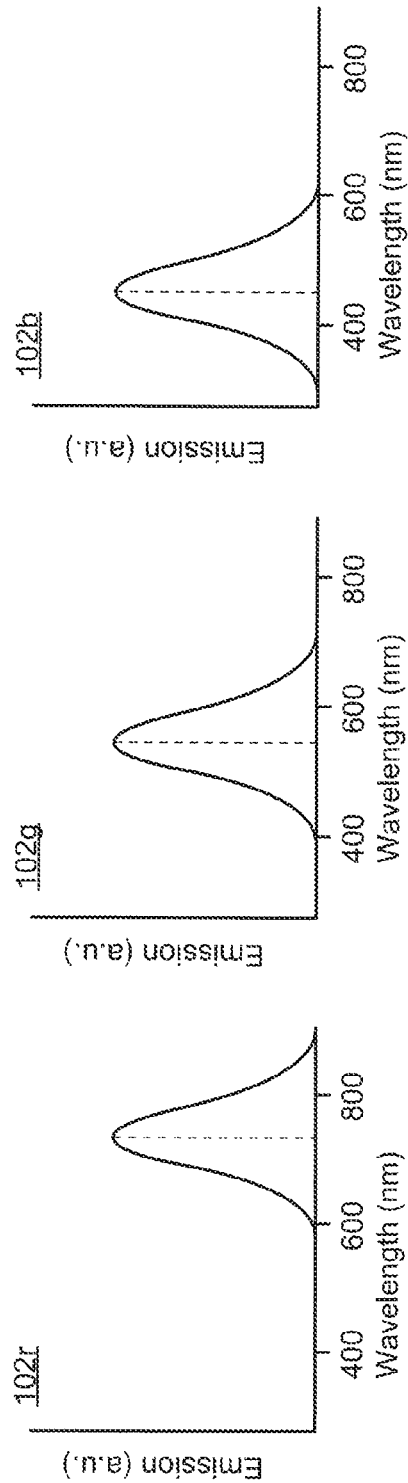

104r

104g

104b

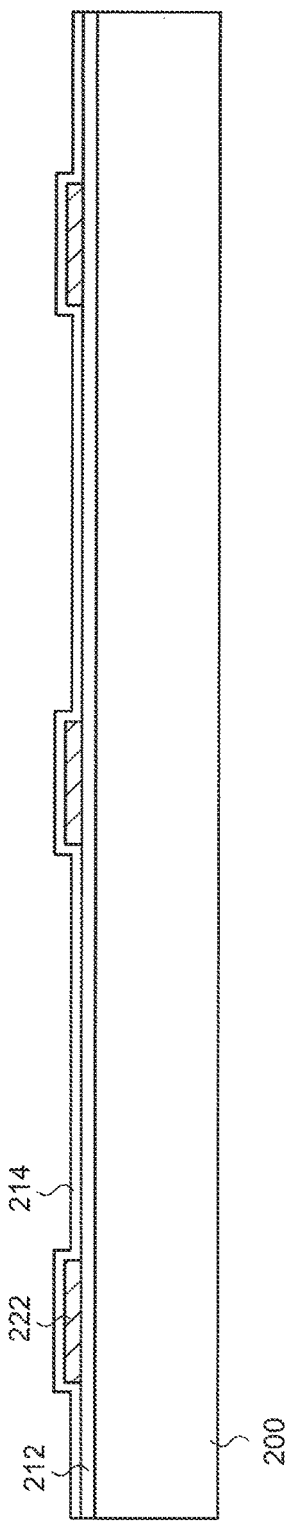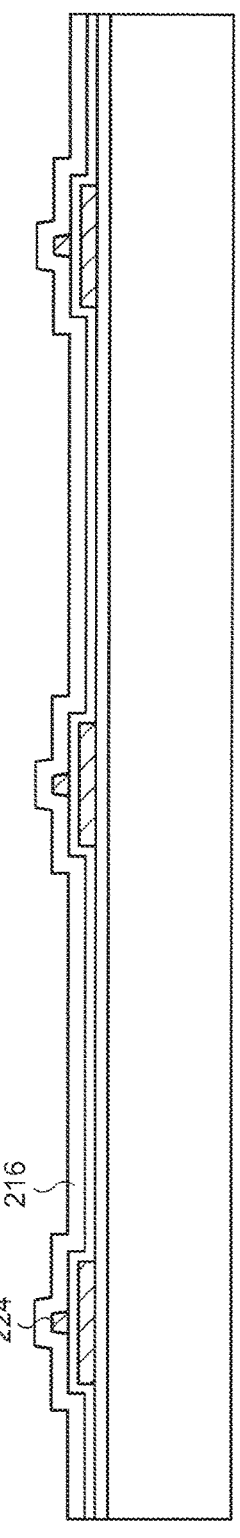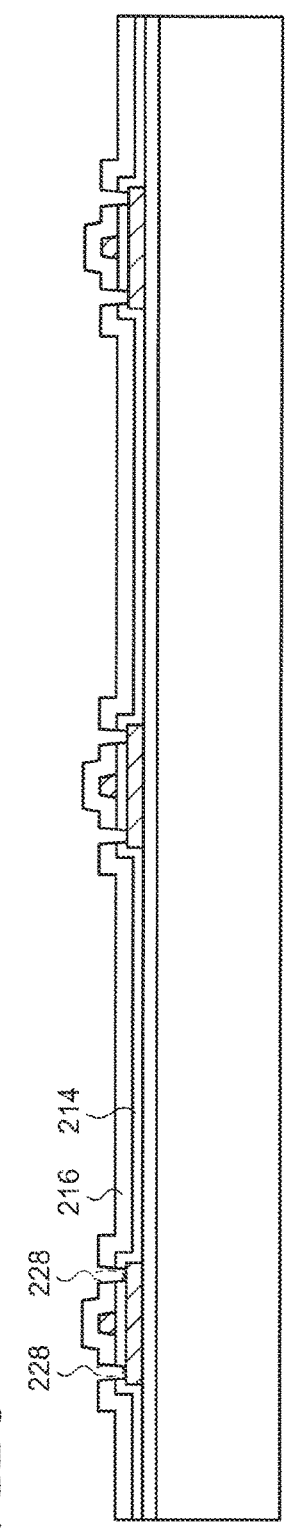

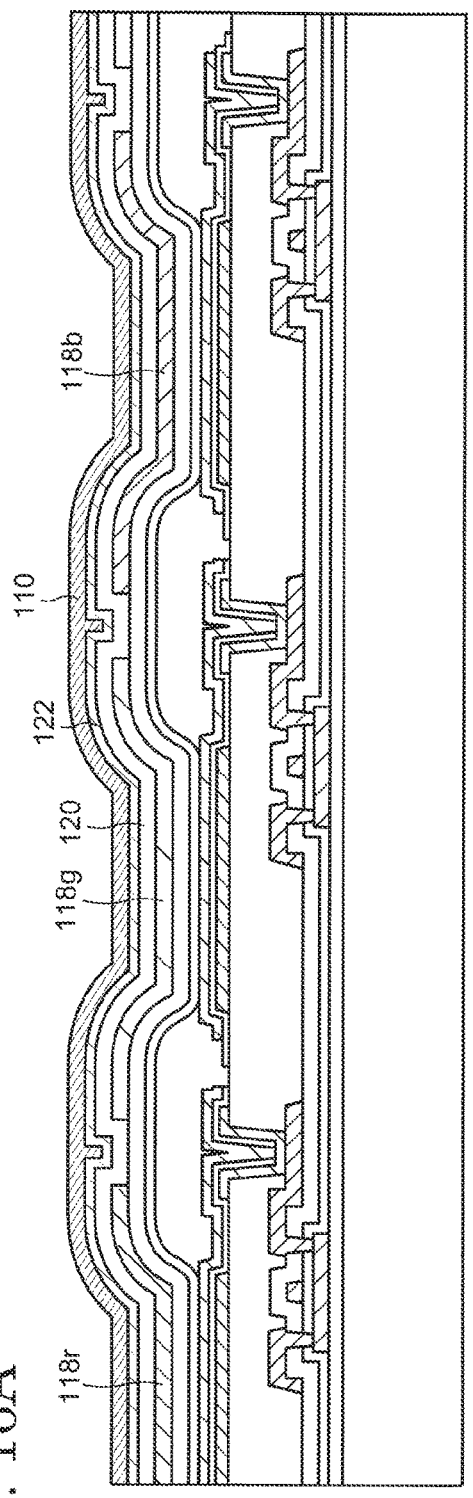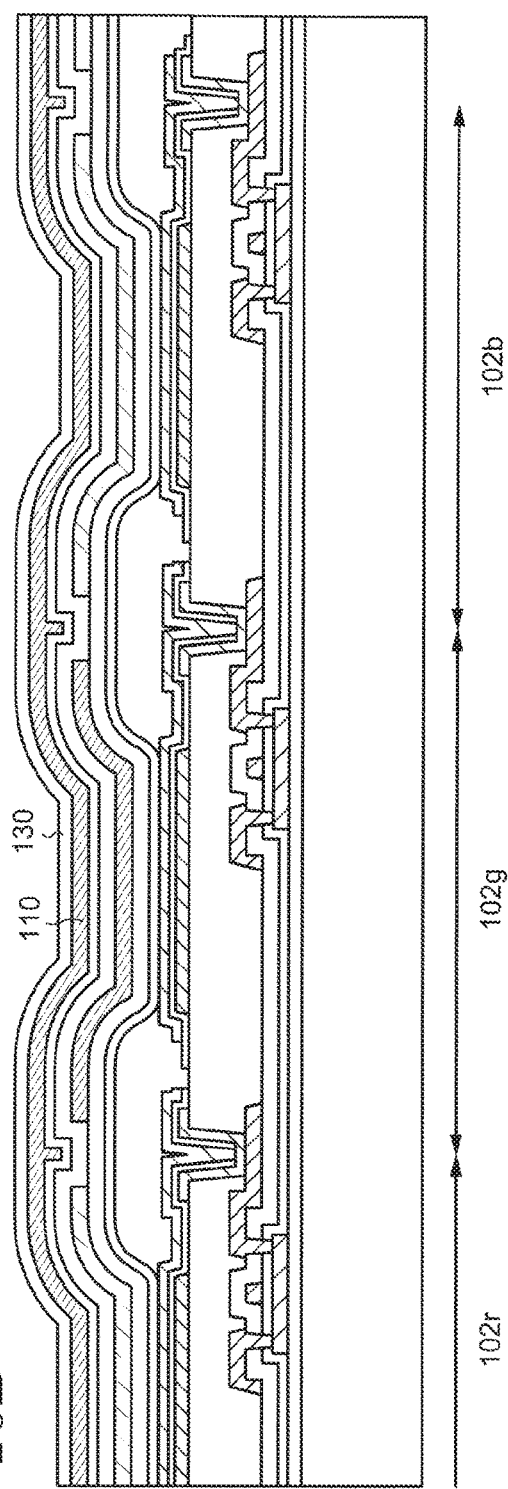

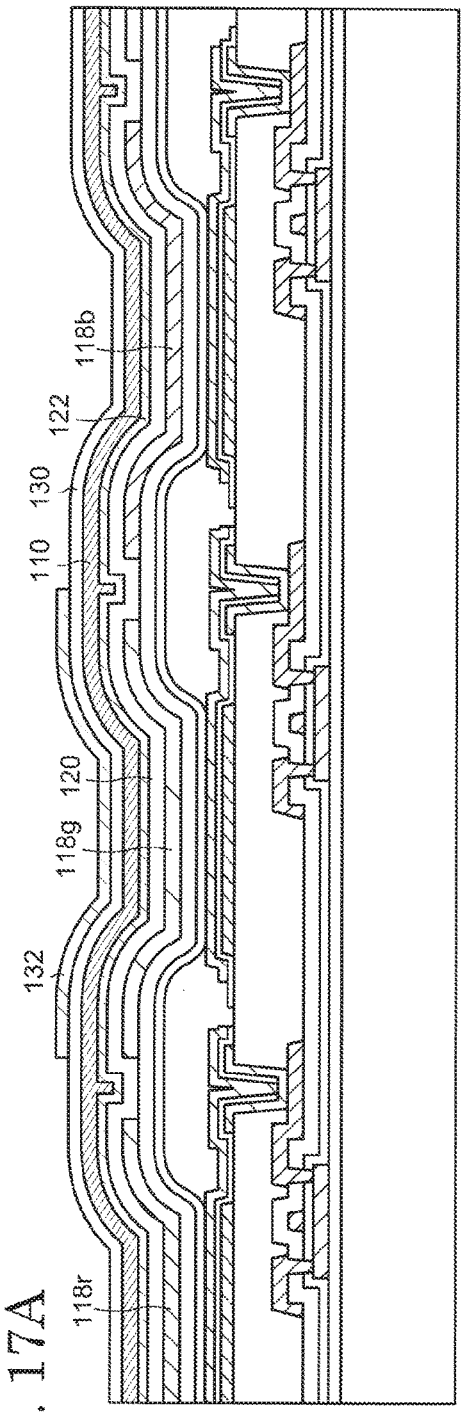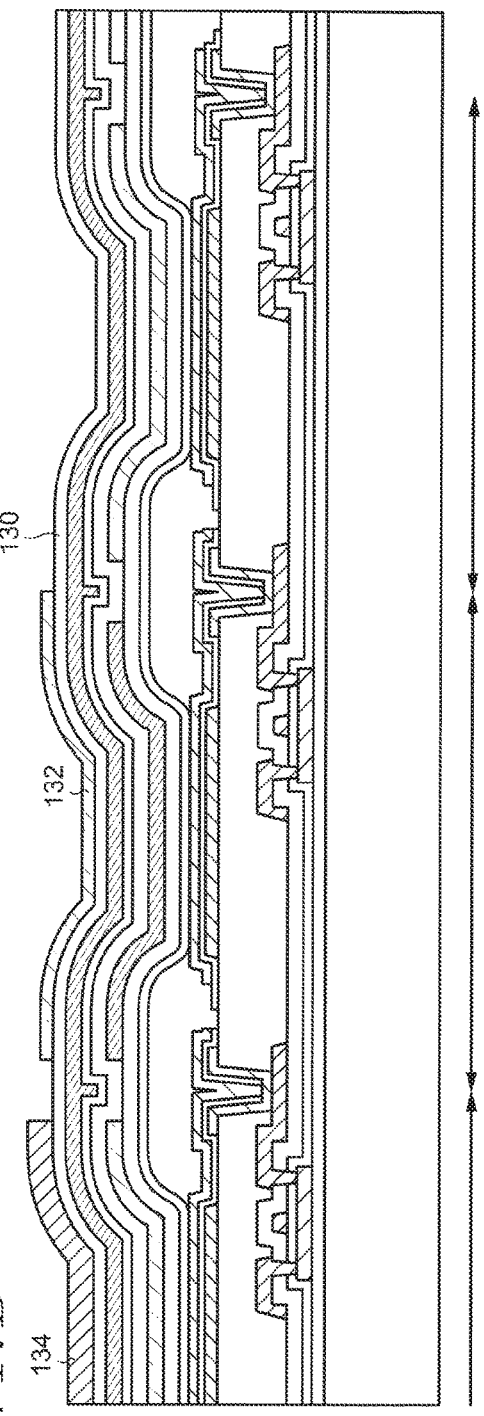

DISPLAY ELEMENT, DISPLAY DEVICE, AND MANUFACTURING METHOD OF THE DISPLAY DEVICE

CROSS REFERENCE TO RELATED APPLICATIONS

This application is based on and claims the benefit of priority from the prior Japanese Patent Application No. 2016-249226, filed on Dec. 22, 2016, the entire contents of which are incorporated herein by reference.

FIELD

An embodiment of the present invention relates to a light-emitting element, a display device including the light-emitting element, and a manufacturing method of the display device.

BACKGROUND

An organic EL (Electroluminescence) display device is represented as an example of a display device. An organic EL display device has an organic light-emitting element (hereinafter, referred to as a light-emitting element) in each of a plurality of pixels formed over a substrate. A light-emitting element possesses a layer (hereinafter, referred to as an EL layer) including an organic compound between a pair of electrodes (cathode and anode) and is driven by supplying a current to the pair of electrodes. A color provided by a light-emitting element is mainly determined by an emission material in an EL layer, and a variety of emission colors can be obtained by appropriately selecting an emission material. Full-color display can be realized by arranging a plurality of light-emitting elements giving different colors over a substrate.

Emission color of a light-emitting element can also be adjusted by utilizing a light-interference effect inside or outside a light-emitting element. For example, Japanese Patent Application Publications No. 2006-302878 and 2006-302879 disclose that a resonance structure is arranged over one electrode of a light-emitting element to resonate emission radiated from the light-emitting element, thereby adjusting emission intensity and emission color.

SUMMARY

An embodiment of the present invention is a display device. The display device possesses: a first pixel, a second pixel, and a third pixel having a first light-emitting element, a second light-emitting element, a third light-emitting element, respectively; a first cap layer; a second cap layer; a third cap layer; and a fourth cap layer. The first cap layer is located over and overlaps with the first light-emitting element, the second light-emitting element, and the third light-emitting element and extends from the first pixel to the third pixel through the second pixel. The second cap layer is located over the first cap layer and overlaps with the second light-emitting element. The third cap layer is located over the first cap layer and overlaps with the third light-emitting element. The fourth cap layer is located over the first cap layer, the second cap layer, and the third cap layer. The first pixel, the second pixel, and the third pixel are arranged in this order. The first light-emitting element, the second light-emitting element, and the third light-emitting element each include: a first electrode; a hole-transporting region over and in contact with the first electrode; an emission layer over and in contact with the hole-transporting region; an electron-transporting region over and in contact with the emission layer; and a second electrode over and in contact with the electron-transporting region. The first light-emitting element, the second light-emitting element, and the third light-emitting element are configured so that an emission wavelength of the second light-emitting element is shorter than an emission wavelength of the third light-emitting element and longer than an emission wavelength of the first light-emitting element. A thickness of the third cap layer is larger than a thickness of the second cap layer.

An embodiment of the present invention is a display device. The display device possesses: a first pixel, a second pixel, and a third pixel having a first light-emitting element, a second light-emitting element, a third light-emitting element, respectively; a first cap layer; a second cap layer; a third cap layer; and a fourth cap layer. The first cap layer is located over and overlaps with the first light-emitting element, the second light-emitting element, and the third light-emitting element and extends from the first pixel to the third pixel through the second pixel. The second cap layer is located over the first cap layer, overlaps with the second light-emitting element and the third light-emitting element, and extends from the second pixel to the third pixel. The third cap layer is located over the second cap layer and overlaps with the third light-emitting element. The fourth cap layer is located over the first cap layer, the second cap layer, and the third cap layer. The first pixel, the second pixel, and the third pixel are arranged in this order. The first light-emitting element, the second light-emitting element, and the third light-emitting element each include: a first electrode; a hole-transporting region over and in contact with the first electrode; an emission layer over and in contact with the hole-transporting region; an electron-transporting region over and in contact with the emission layer; and a second electrode over and in contact with the electron-transporting region.

An embodiment of the present invention is a manufacturing method of a display device. The manufacturing method includes: forming a first light-emitting element, a second light-emitting element, and a third light-emitting element in a first pixel, a second pixel, and a third pixel, respectively; forming a first cap layer over the first light-emitting element, the second light-emitting element, and the third light-emitting element, the first cap layer extending from the first pixel to the third pixel through the second pixel; forming a second cap layer over the first cap layer, the second cap layer overlapping with the second light-emitting element; forming a third cap layer over the first cap layer, the third cap layer overlapping with the third light-emitting element; and forming a fourth cap layer over the first cap layer, the second cap layer, and the third cap layer, the fourth cap layer extending from the first pixel to the third pixel through the second pixel. The first light-emitting element, the second light-emitting element, and the third light-emitting element each include: a first electrode; a hole-transporting region over and in contact with the first electrode; an emission layer over and in contact with the hole-transporting region; an electron-transporting region over and in contact with the emission layer; and a second electrode over and in contact with the electron-transporting region. The first pixel, the second pixel, and the third pixel are arranged in this order.

An embodiment of the present invention is a manufacturing method of a display device. The manufacturing method includes: forming a first light-emitting element, a second light-emitting element, and a third light-emitting element in a first pixel, a second pixel, and a third pixel, respectively; forming a first cap layer over the first light-emitting element, the second light-emitting element, and the third light-emitting element, the first cap layer extending from the first pixel to the third pixel through the second pixel; forming a second cap layer over the first cap layer, the second cap layer overlapping with the second light-emitting element and the third light-emitting element; forming a third cap layer over the second cap layer, the third cap layer overlapping with the third light-emitting element; and forming a fourth cap layer over the first cap layer, the second cap layer, and the third cap layer, the fourth cap layer extending from the first pixel to the third pixel through the second pixel. The first light-emitting element, the second light-emitting element, and the third light-emitting element each include: a first electrode; a hole-transporting region over and in contact with the first electrode; an emission layer over and in contact with the hole-transporting region; an electron-transporting region over and in contact with the emission layer; and a second electrode over and in contact with the electron-transporting region. The first pixel, the second pixel, and the third pixel are arranged in this order.

BRIEF DESCRIPTION OF DRAWINGS

FIG. 1A to FIG. 10 are schematic cross-sectional views of a display device according to an embodiment of the present invention;

FIG. 2 is a schematic top view of a display device according to an embodiment of the present invention;

FIG. 4A and FIG. 4B are diagrams for explaining emission spectra of a display device according to an embodiment of the present invention;

FIG. 5 is a schematic cross-sectional view of a display device according to an embodiment of the present invention;

FIG. 7 is a schematic cross-sectional view of a display device according to an embodiment of the present invention;

FIG. 9 is a schematic cross-sectional view of a display device according to an embodiment of the present invention;

FIG. 10 is a schematic perspective view of a display device according to an embodiment of the present invention;

FIG. 12A to FIG. 12C are schematic cross-sectional views for explaining a manufacturing method of a display device according to an embodiment of the present invention;

FIG. 16A and FIG. 16B are schematic cross-sectional views for explaining a manufacturing method of a display device according to an embodiment of the present invention;

FIG. 17A and FIG. 17B are schematic cross-sectional views for explaining a manufacturing method of a display device according to an embodiment of the present invention;

DESCRIPTION OF EMBODIMENTS

Hereinafter, the embodiments of the present invention are explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present invention, when a plurality of films is formed by processing one film, the plurality of films may have functions or rules different from each other. However, the plurality of films originates from a film formed as the same layer in the same process and has the same layer structure and the same material. Therefore, the plurality of films is defined as films existing in the same layer.

In the specification and the scope of the claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

First Embodiment

1. Light-Emitting Element

Figure 1A:
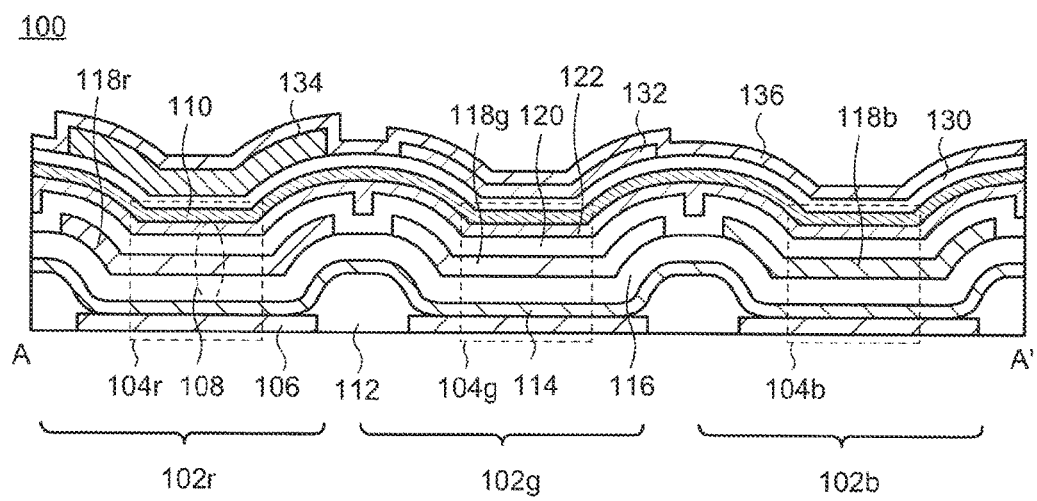
Figure 2:
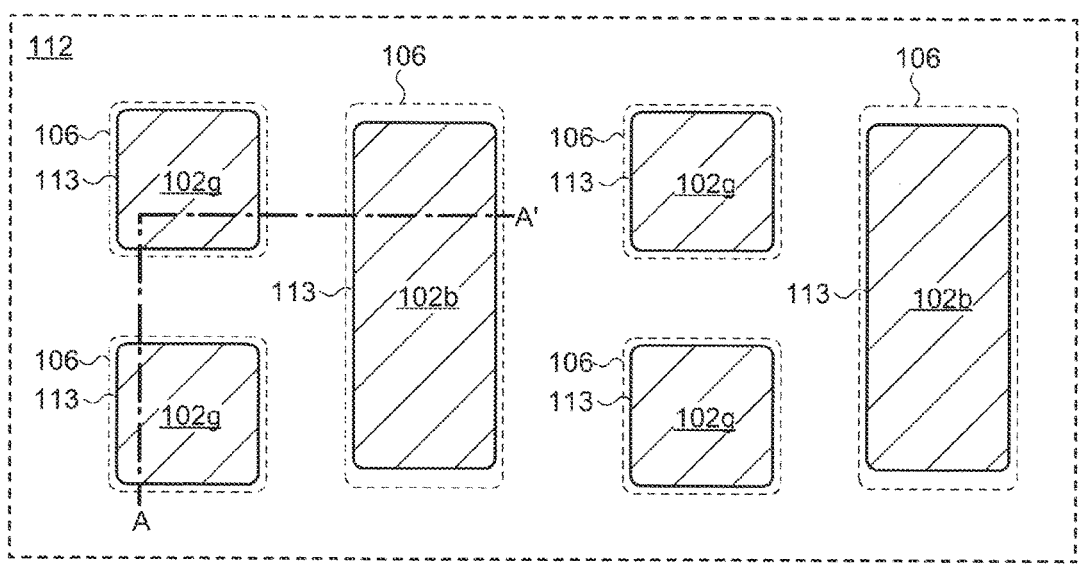

FIG. 1A and FIG. 2 are respectively schematic cross-sectional and top views of a display device 100 according to the First Embodiment. A cross-section along a chain line A-A' of FIG. 2 corresponds to FIG. 1A. As shown in FIG. 2, the display device 100 has a plurality of pixels 102. Three adjacent pixels, i.e., a first pixel 102*b*, a second pixel 102*g*, and a third pixel 102*r*, are illustrated in FIG. 2. These adjacent pixels 102 are capable of providing different colors from one another. For example, three kinds of pixels 102 giving the three primary colors of red, green, and blue colors may be arranged, by which full-color display can be accomplished. The following explanation is given for a case where the first pixel 102*b*, the second pixel 102*g*, and the third pixel 102*r* give blue, green, and red colors, respectively. However, the structure of the display device 100 is not limited thereto as long as the display device 100 is configured so that adjacent two pixels 102 provide different colors. For example, the display device 100 may be configured so that an emission wavelength obtained from the second pixel 102*g* is longer than an emission wavelength obtained from the first pixel 102*b* and shorter than an emission wavelength obtained from the third pixel 102*r*. Here, an emission wavelength corresponds to a peak wavelength of emission obtained from the pixel 102, an emission peak wavelength of a light-emitting element 104 (described below) disposed in each pixel 102, or an emission peak wavelength of an emission material in the light-emitting element 104.

In FIG. 2, an example is demonstrated where the pixels 102 have different areas therebetween so that the area of the first pixel 102b is maximum and the second pixel 102g and the third pixel 102r have the same size and area. However, there is no limitation to the arrangement and size of the pixels 102, and the first pixel 102b, the second pixel 102g, and the third pixel 102r may be the same as or different from one another in size and shape. Moreover, the arrangement of the pixels 102 may be a stripe arrangement, a delta arrangement, a mosaic arrangement, or a Pentile arrangement.

As shown in FIG. 1A, the light-emitting elements 104b, 104g, and 104r are disposed in the first to third pixels 102b, 102g, and 102r, respectively. Each of the light-emitting elements 104b, 104g, and 104r is structured by a first electrode 106, an EL layer 108 over the first electrode 106, and a second electrode 110 over the EL layer 108. Hereinafter, the light-emitting elements 104b, 104g, and 104r are expressed as a first light-emitting element, a second light-emitting element, and a third light-emitting element, respectively. Note that a substrate for supporting the pixels 102, a variety of circuits for driving the pixels 102, and the like are omitted in FIG. 1A.

The first electrodes 106 are disposed in every pixel 102 and configured so as to be independently applied with a potential. On the other hand, the second electrode 110 is formed across the plurality of pixels 102 and shared by the plurality of pixels 102. The display device 100 is configured so that a constant potential is applied to the second electrode 110.

The first electrode 106 and the second electrode 110 are configured so that one transmits visible light and the other reflects visible light. One of the first electrode 106 and the second electrode 110 functions as an anode, and the other functions as a cathode. In the present embodiment, an explanation is provided for a case where the first electrode 106 serves as an anode reflecting visible light and the second electrode 110 serves as a cathode (semi-transparent and semi-reflective cathode) partly reflecting and partly transmitting visible light. In this case, the first electrode 106 may be formed by using a metal with high reflectivity, such as silver and aluminum, or an alloy thereof. Alternatively, a film of a conductive oxide having a light-transmitting property may be formed over a film including the metal or alloy. As a conductive oxide, indium-tin oxide (ITO), indium-zinc oxide (IZO), and the like are represented. It is possible to use, for the second electrode 110, a metal thin film including a metal such as aluminum, magnesium, and silver or an alloy thereof and having a thickness allowing visible light to pass therethrough. Alternatively, a conductive oxide having a light-transmitting property, such as ITO and IZO, may be used. When the metal thin film is used as the second electrode 110, a conductive oxide having a light-transmitting property may be stacked over the metal thin film.

A partition wall 112 which is an insulating film is disposed between the first electrodes 106 of the adjacent pixels 102. FIG. 2 shows the first electrodes 106 and the partition wall 112 while the first electrodes 106 are exposed in opening portions 113 of the partition wall 112 and edge portions of the first electrodes 106 are covered by the partition wall 112. With this structure, steps caused by the edge portions of the first electrodes 106 are relieved, and disconnection of the EL layer 108 or the second electrode 110 formed thereover can be prevented.

The EL layer 108 is formed so as to be in contact with and cover the first electrode 106 and the partition wall 112 (FIG. 1A). The second electrode 110 is disposed so as to be in contact with the EL layer 108. In the specification and claims, the EL layer 108 means the films sandwiched by the first electrode 106 and the second electrode 110.

The structure of the EL layer 108 may be arbitrarily determined. In the display device 100 shown in FIG. 1A, the EL layer 108 includes a hole-injection layer 114, a hole-transporting layer 116, an emission layer 118, an electron-transporting layer 120, and an electron-injection layer 122. It is not necessary for the EL layer 108 to possess all of these five layers, and one layer may have functions of two layers. Each layer may have a single-layer structure or may be formed of stacked layers of different materials.

The hole-injection layer 114 has a function to promote hole injection to the EL layer 108 from the first electrode 106. The hole-injection layer 114 may be provided so as to be in contact with the first electrode 106 and the partition wall 112. For the hole-injection layer 114, a compound to which holes are readily injected, that is, a compound readily oxidized (i.e., electron-donating compound) can be used. In other words, a compound whose level of the highest occupied molecular orbital (HOMO) is shallow can be used. For example, an aromatic amine such as a benzidine derivative and a triarylamine, a carbazole derivative, a thiophene derivative, a phthalocyanine derivative such as copper phthalocyanine, and the like can be used. Alternatively, a polymer material such as polythiophene, polyaniline, or a derivative thereof may be used. Poly(3,4-ethylenedioxythiophene)/poly(styrenesulfonic acid) is represented as an example. Alternatively, a mixture of an electron-donating compound such as the aforementioned aromatic amine, carbazole derivative, or aromatic hydrocarbon with an electron acceptor may be used. As an electron acceptor, a transition-metal oxide such as vanadium oxide and molybdenum oxide, a nitrogen-containing heteroaromatic compound, an aromatic compound having a strong electron-withdrawing group such as a cyano group, and the like are represented.

The hole-transporting layer 116 has a function to transport holes injected to the hole-injection layer 114 to the emission layer 118, and a material the same as or similar to the material usable in the hole-injection layer 114 can be used. For example, it is possible to use a material having a deeper HOMO level than that of the hole-injection layer 114 and having a difference in HOMO level from the hole-injection layer 114 by approximately 0.5 eV or less. Typically, an aromatic amine such as a benzidine derivative can be used.

The emission layer 118 may be formed with a single compound or have the so-called host-guest type structure. In the case of the host-guest type structure, a stillbene derivative, a condensed aromatic compound such as an anthracene derivative, a carbazole derivative, a metal complex including a ligand having a benzoquinolinol as a basic skeleton, an aromatic amine, a nitrogen-containing heteroaromatic compound such as a phenanthroline derivative, and the like can be used as a host material, for example. A guest functions as an emission material, and a fluorescent material such as a coumarin derivative, a pyran derivative, a quinacridone derivative, a tetracene derivative, a pyrene derivative, and an anthracene derivative, or a phosphorescent material such as an iridium-based orthometal complex can be used. When the emission layer 118 is configured with a single compound, the aforementioned host material can be used as an emission material.

As shown in FIG. 1A, the emission layers 118 may have different structures or include different emission materials between the adjacent pixels 102. With this configuration, emission colors different between the adjacent pixels 102 can be generated. The emission layer 118 in the display device 100 may be configured so that the emission wavelength of the emission material included in the emission layer 118g of the second light-emitting element 114g is shorter than in the emission layer 118r of the third light-emitting element 114r and longer than in the emission layer 118b of the first light-emitting element 104b.

The electron-transporting layer 120 has a function to transport electrons injected from the second electrode 110 through the electron-injection layer 122 to the emission layer 118. For the electron-transporting layer 120, a compound readily reduced (i.e., electron-accepting compound) can be used. In other words, a compound whose level of the lowest unoccupied molecular orbital (LUMO) is deep can be used. For example, a metal complex including a ligand having a benzoquinolinol as a basic skeleton, such as tris(8-quinolinolato)aluminum and tris(4-methyl-8-quinolinolato)aluminum, a metal complex including a ligand having an oxathiazole or thiazole as a basic skeleton, and the like are represented. In addition to these metal complexes, a compound with an electron-deficient heteroaromatic ring, such as an oxadiazole derivative, a thiazole derivative, a triazole derivative, and a phenanthroline derivative, can be used.

For the electron-injection layer 122, a compound which promotes electron injection to the electron-transporting layer 120 from the second electrode 110 can be used. For example, a mixture of a compound usable in the electron-transporting layer 120 with an electron donor such as lithium or magnesium can be used. Alternatively, an inorganic compound such as lithium fluoride and calcium fluoride may be used.

In the present specification and claims, a region from an upper surface of the first electrode 106 to a bottom surface of the emission layer 118 is defined as a hole-transporting region, and a region from an upper surface of the emission layer 118 to a bottom surface of the second electrode 110 is defined as an electron-transporting region. The hole-injection layer 114 and the hole-transporting layer 116 are included in the hole-transporting region, while the electron-transporting layer 120 and the electron-injection layer 122 are included in the electron-transporting region. Therefore, the EL layer 108 is structured with the hole-transporting region, the emission layer 118, and the electron-transporting region. When a layer (e.g., the hole-transporting layer 116 or the electron-transporting layer 120) other than the emission layer 118 functions as an emission layer, the EL layer 108 is structured with the hole-transporting region and the electron-transporting region.

When a potential difference is provided between the first electrode 106 and the second electrode 110, holes and electrons are injected to the EL layer 108 from the former and the latter, respectively. Holes are transported to the emission layer 118 through the hole-injection layer 114 and the hole-transporting layer 116, while electrons are transported to the emission layer 118 through the electron-injection layer 122 and the electron-transporting layer 120. Holes and electrons are recombined in the emission layer 118, by which an excited state of the emission material included in the emission layer 118 is produced. When the excited state relaxes to a ground state, light having a wavelength corresponding to an energy difference between the excited state and the ground state is radiated and observed as the light emission from each light-emitting element 104.

Each layer included in the EL layer 108 may be formed by applying a wet-type film-formation method such as an ink-jet method, a spin-coating method, a printing method, and a dip-coating method or a dry-type film-formation method such as an evaporation method. The EL layer 108 may further possess a hole-blocking layer, an electron-blocking layer, an exciton-blocking layer, and the like other than the aforementioned layers, for example.

2. Resonance Structure

A resonance structure may be arranged over the second electrode 110 of the display device 100. The resonance structure may be structured by a plurality of cap layers (a first cap layer 130, a second cap layer 132, a third cap layer 134, and a fourth cap layer 136) as shown in FIG. 1A.

The first cap layer 130 is disposed so as to overlap with the first light-emitting element 104b, the second light-emitting element 104g, and the third light-emitting element 104r. In other words, the first cap layer 130 is shared by the first pixel 102b, the second pixel 102g, and the third pixel 102r and extends from the first pixel 102b to the third pixel 102r through the second pixel 102g.

The second cap layer 132 is arranged over the first cap layer 130 so as to overlap with the second light-emitting element 104g. The second cap layer 132 may be in contact with the first cap layer 130. The third cap layer 134 is provided over the first cap layer 130 so as to overlap with the third light-emitting element 104r. The third cap layer 134 may be in contact with the first cap layer 130.

The fourth cap layer 136 is formed over the first cap layer 130, the second cap layer 132, and the third cap layer 134 so as to overlap with the first light-emitting element 104b, the second light-emitting element 104g, and the third light-emitting element 104r. Therefore, the fourth cap layer is also shared by the first pixel 102b, the second pixel 102g, and the third pixel 102r and extends from the first pixel 102b to the third pixel 102r through the second pixel 102g. The fourth cap layer 136 may be in contact with the first cap layer 130, the second cap layer 132, and the third cap layer 134 in the first pixel 102b, the second pixel 102g, and the third pixel 102r, respectively.

Here, a thickness of the third cap layer 134 is larger than a thickness of the second cap layer 132. The first cap layer 130 and the fourth cap layer 136 have substantially the same thickness in the plurality of pixels 102. Hence, the thicknesses of the resonance structures provided over the first light-emitting element 104b, the second light-emitting element 104g, and the third light-emitting element 104r increase in the order of the first light-emitting element 106b, the second light-emitting element 104g, and the third light-emitting element 104r.

The first cap layer 130, the second cap layer 132, and the third cap layer 134 may include a material having a high transmittance in the visible region and a relatively high refraction index. As an example of such a material, an organic compound is represented. An organic compound may be a hole-transporting material or an electron-transporting material. As an organic compound, a polymer material is representative, and a polymer material including sulfur, halogen, or phosphorous is exemplified. As a polymer including sulfur, a polymer having a substituent such as a thioether, a sulfone, and a thiophene in the main or side chain is given. As a polymer material including phosphorous, a polymer material including a phosphorous acid, a phosphoric acid, or the like in the main or side chain, a polyphosphazene, or the like is represented. As a polymer material including halogen, a polymer material including bromine, iodine, or chlorine as a substituent is exemplified. The polymer material may be intermolecularly or intramolecularly cross-linked.

As another example, an inorganic material is represented, and titanium oxide, zirconium oxide, chromium oxide, aluminum oxide, indium oxide, ITO, IZO, lead sulfide, zinc sulfide, silicon nitride, and the like are exemplified. A mixture of the inorganic compound and the polymer material may be used.

The first cap layer 130, the second cap layer 132, and the third cap layer 134 may have the same material as one another. Alternatively, one may include a material different from other materials, or these three layers may include materials different from one another.

In contrast, the fourth cap layer 136 may include a material having a high transmittance and a relatively low refractive index in the visible region. As an example, a polymer including fluorine is represented. As a polymer material including fluorine, polytetrafluoroethylene, poly (vinylidene fluoride), and a derivative thereof as well as a poly(vinyl ether), a poly(methacrylic ester), a poly(acrylic ester), and a polysiloxane which include fluorine in the main chain or side chain, and the like are represented. These polymers may be intramolecularly or intermolecularly cross-linked.

As an inorganic material having a low refractive index, a metal fluoride such as lithium fluoride, magnesium fluoride, and calcium fluoride, and silicon oxide including boronic acid or phosphorus oxide are represented.

Figure 3A:
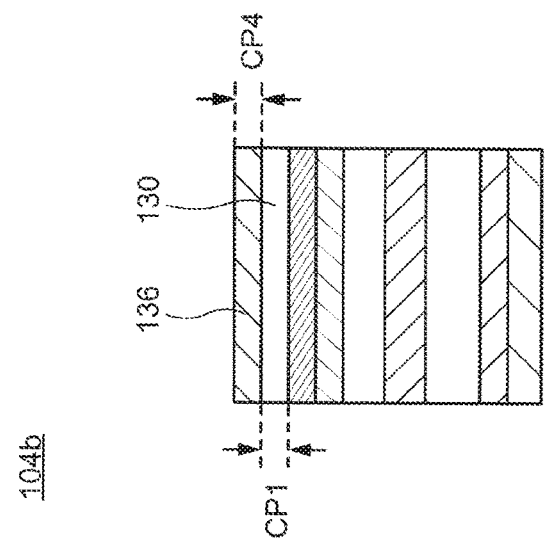
FIG. 3A to FIG. 3C are schematic cross-sectional views of a display device according to an embodiment of the present invention.
Figure 3B:
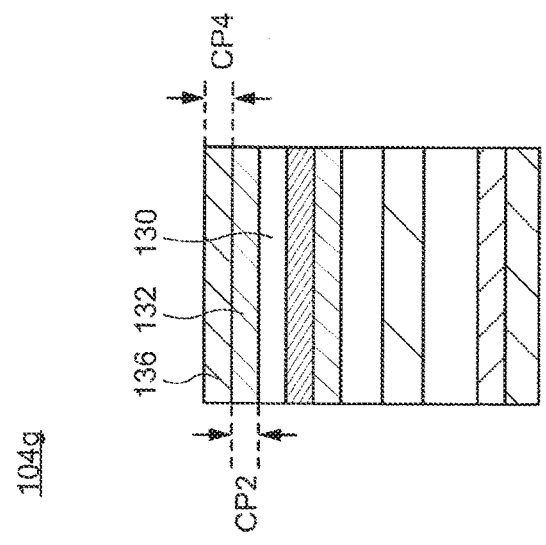
Figure 3C:
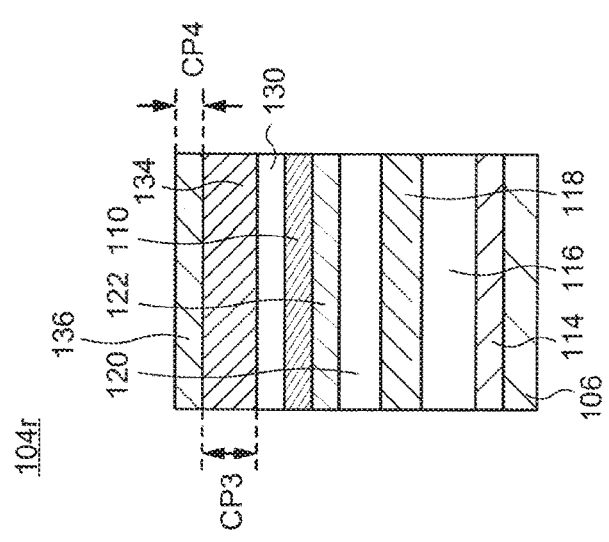

Detailed structures of the third light-emitting element 104r, the second light-emitting element 104g, and the first light-emitting element 104b are shown in FIG. 3A, FIG. 3B, and FIG. 3C, respectively. The first cap layer 130 and the fourth cap layer 136 are provided over the first light-emitting element 104b as the resonance structure. A stack of the first cap layer 130, the second cap layer 132, and the fourth cap layer 136 is arranged over the second light-emitting element 104g as the resonance structure. The first cap layer 130, the third cap layer 134, and the fourth cap layer 136 are disposed over the third light-emitting element 104r as the resonance structure. Here, the thicknesses of the first cap layer 130, the second cap layer 132, the third cap layer 134, and the fourth cap layer 136 are represented by CP1, CP2, CP3, and CP4, respectively. CP4 may be larger than CP1 and may be equal to or less than a summation of CP1 and CP2. Alternatively, CP1 may be larger than CP2 and equal to or less than CP3.

Figure 1B:
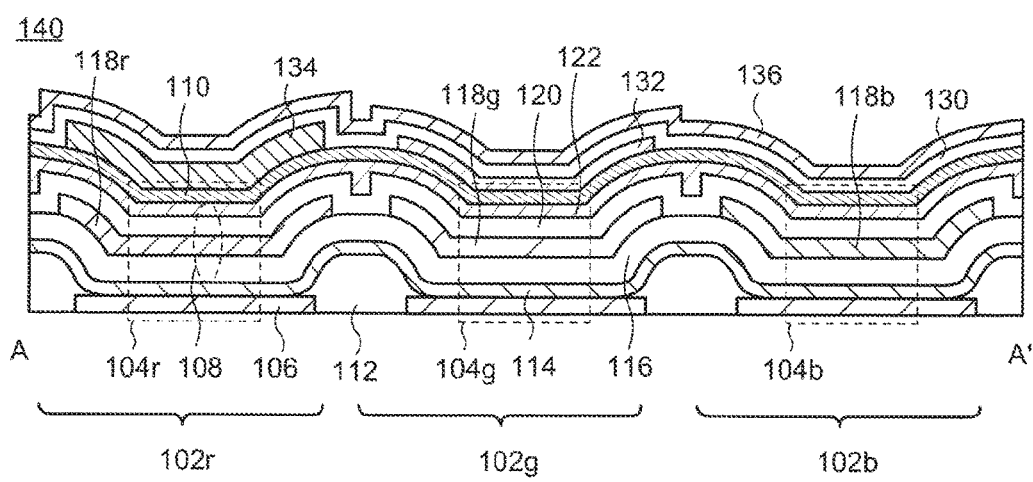
Figure 1C:
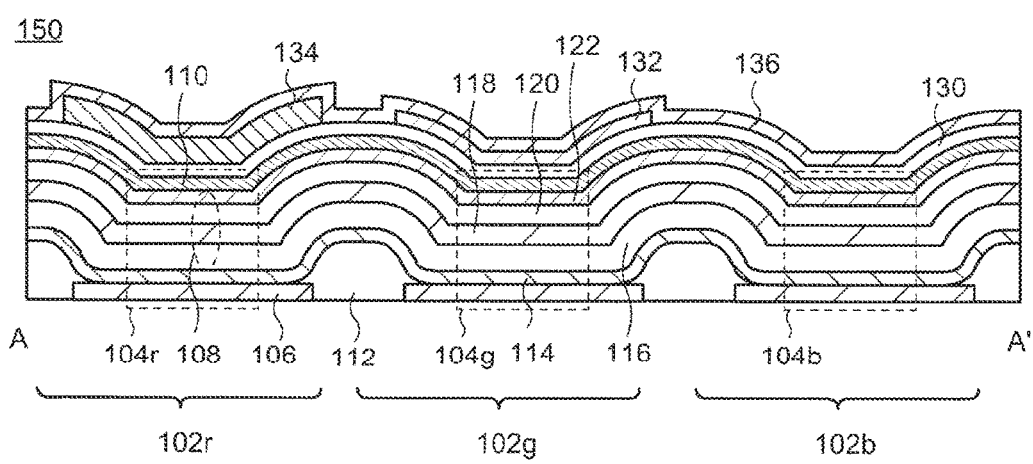

It is not always necessary to arrange the first cap layer 130 between the second electrode 110 and the second cap layer 132 or between the second electrode 110 and the third cap layer 134. For example, similar to a display device 140 shown in FIG. 1B, the first cap layer 130 may be arranged over the second cap layer 132 and the third cap layer 134 so as to overlap with the first light-emitting element 104b, the second light-emitting element 104g, and the third light-emitting element 104r. In this case, the second cap layer 132 and the third cap layer 134 can be in contact with the second electrode 110.

3. Resonance

The cap layer formed over each light-emitting element 104 functions as a resonance structure to resonate the light extracted from the light-emitting element 104 through the second electrode 110. For example, in the case of the first light-emitting element 104b, the resonance structure is the first cap layer 130 with the thickness CP1 and the fourth cap layer 136 with the thickness CP4. The light obtained from the emission layer 118b enters, through the second electrode 110, the first cap layer 130 directly or after resonating in the first light-emitting element 104b (that is, between the top surface of the first electrode 106 and the bottom surface of the second electrode 110). The incident light resonates in the first cap layer 130 and the fourth cap layer 136.

In this state, light with a wavelength consistent with an optical distance of the resonance structure including the first cap layer 130 and the fourth cap layer 136 is amplified by an interference effect while repeating reflection between the bottom surface of the first cap layer 130 and the top surface of the fourth cap layer 136, whereas light with a wavelength inconsistent with the optical distance is attenuated. Here, an optical distance is a product of a thickness of a layer and a refractive index of a layer. In the case of the resonance structure of the first light-emitting element 104b, the optical distance is a summation of a product of the refractive index of the first cap layer 130 by the thickness CP1 and a product of the refractive index of the fourth cap layer 136 by the thickness CP4. When an odd multiple of one fourth of $\lambda_b$ ($\lambda_b/4$) is the same as or close to the optical distance where $\lambda_b$ is a wavelength of the light extracted from the first light-emitting element 104b, the light having this wavelength $\lambda_b$ is consistent with the optical distance and amplified. On the other hand, when an integral multiple of one second of $\lambda_b$ ($\lambda_b/2$), that is, an integral multiple of a half wavelength is the same as or close to the optical distance, the light having this wavelength $\lambda_b$ is inconsistent with the optical distance and attenuated. Therefore, the thicknesses and the materials of the first cap layer 130 and the fourth cap layer 136 are optimized so that the optical distance of the resonance structure including the first cap layer 130 and the fourth cap layer 136 is an odd multiple of $\lambda_b/4$, by which a full-width half-maximum of the light emission obtained from the first pixel 102b is decreased, color purity is improved, and luminance in a front direction of the first pixel 102b is increased.

In the second light-emitting element 104g, the resonance structure is the stack of the first cap layer 130, the second cap layer 132, and the fourth cap layer 136. This structure allows the optical distance of the resonance structure of the second light-emitting element 104g to be larger than that of the first light-emitting element 104b. As described above, the display device 100 is configured so that the emission wavelength of the second light-emitting element 104g is longer than the emission wavelength of the first light-emitting element 104b. Hence, employment of the above structure enables construction of a resonance structure which is suitable for not only the first light-emitting element 104b but also the second light-emitting element 104g. As a result, a full-width half-maximum of the light obtained from the second pixel 102g is decreased, color purity is improved, and luminance in a front direction of the second pixel 102g is increased.

Similarly, the resonance structure in the third light-emitting element 104r is the stack of the first cap layer 130, the third cap layer 134, and the fourth cap layer 136. As described above, a resonance structure having a much larger optical distance than that of the second light-emitting element 104g can be formed by setting the thickness CP3 of the third cap layer 134 to be larger than the thickness CP2 of the second cap layer 132. Furthermore, the display device 100 is configured so that the emission wavelength of the third light-emitting element 104r is longer than the emission wavelength of the second light-emitting element 104g. Hence, the use of the above structure enables construction of a resonance structure which is suitable for not only the first light-emitting element 104b and the second light-emitting element 104g but also the third light-emitting element 104r. Accordingly, a full-width half-maximum of the light obtained from the third pixel 102r is decreased, color purity is improved, and luminance in a front direction of the third pixel 102r is increased.

As described above, the resonance structures different in structure and thickness between pixels 102 are formed over the light-emitting elements 104 in the display device 100, by which the optimized resonance structures can be provided for each of the pixels having the light-emitting elements with different emission wavelengths. As described later for a manufacturing method of the display device 100, when such a resonance structure is constructed, an evaporation method using a fine metal mask is normally applied to arrange the resonance structure in every pixel 102. Therefore, when three kinds of resonance structures are fabricated, it is necessary to conduct evaporative deposition using a fine metal mask three times. Evaporative deposition using a fine metal mask has the following disadvantages: alignment of a metal mask is relatively difficult; a material is unexpectedly deposited on a region shielded by a metal mask; evaporative deposition cannot be always conducted in all of the target regions because opening portions of a metal mask may be blocked; and contact of a metal mask with a light-emitting element damages the light-emitting element resulting in emission failure (dark spot). Therefore, yield and reliability of a display device decrease with an increasing number of evaporative depositions using a metal mask.

On the other hand, the first cap layer 130 and the fourth cap layer 136 can be commonly provided over the plurality of pixels 102 in the display device 100 as shown in FIG. 1A and FIG. 3A to FIG. 3C. With this structure, the use of a fine metal mask can be avoided when the first cap layer 130 and the fourth cap layer 136 are prepared with an evaporation method. Hence, the number of evaporative depositions using a fine metal mask can be decreased, and a display device with improved reliability can be manufactured with a good yield. Additionally, since the optimized resonance structure can be constructed in each of the pixels 104 with different emission colors, a display device having high color reproducibility and high efficiency, that is, a display device with low power consumption can be produced.

Second Embodiment

Figure 10:
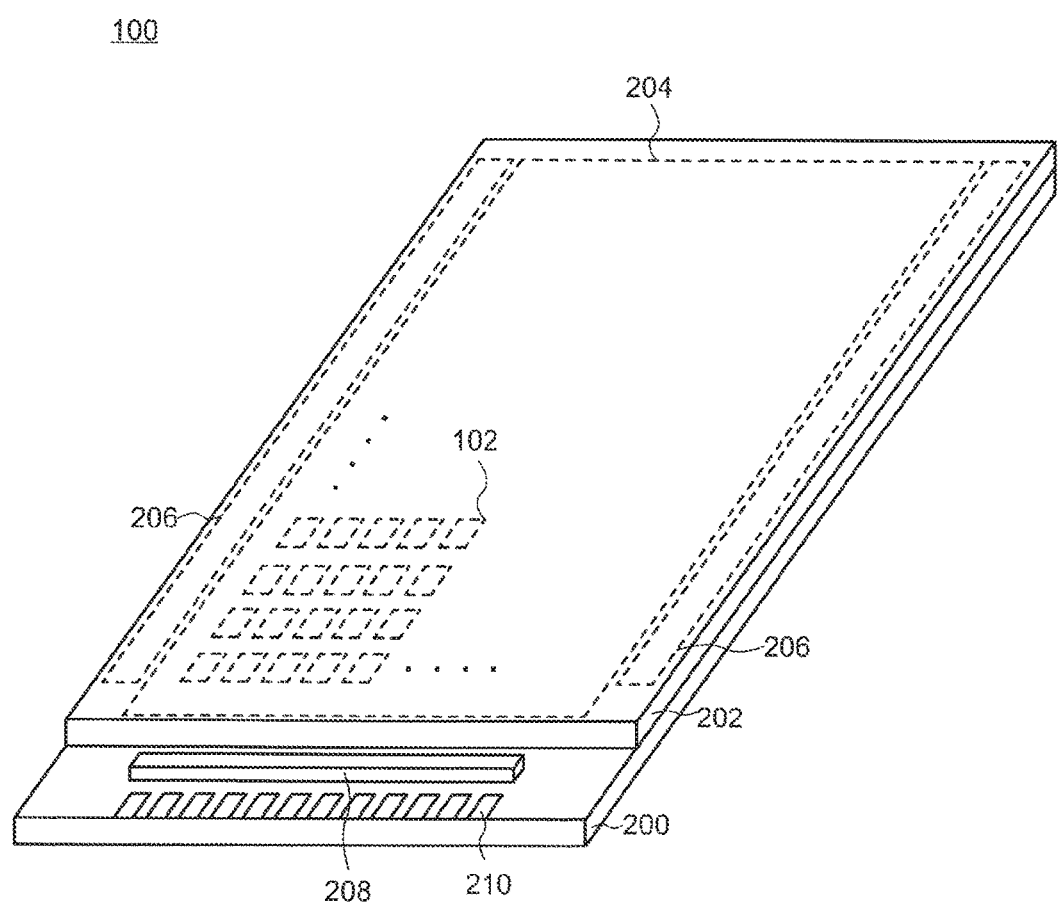

In the present embodiment, a display device 150 having a structure different from those of the display devices 100 and 140 of the First Embodiment is explained. The display device 100 possesses different emission layers 118 between the adjacent pixels 102, while the display device 150 has the same emission layer 118 between the adjacent pixels 102. Specifically, the emission layer 118 of the display device 150 has a common structure in the first pixel 102b, the second pixel 102g, and the third pixel 102r and extends from the first pixel 102b to the third pixel 102r through the second pixel 102g as shown in FIG. 10. That is, the emission layer 118 is shared by the first pixel 102b, the second pixel 102g, and the third pixel 102r.

In such a structure, the emission layer 118 may be configured to provide white emission. Emission spectra of this case are schematically shown in FIG. 4A and FIG. 4B. FIG. 4A shows, in order from right to left, emission spectra provided by the emission layers 118 of the first light-emitting element 104b, the second light-emitting element 104g, and the third light-emitting element 104r. Since the emission layers 118 have the same structure between the first light-emitting element 104b, the second light-emitting element 104g, and the third light-emitting element 104r and give white emission, the spectra of the emission layers 118 are the same in shape, broad, and almost entirely cover the visible region.

FIG. 4B shows, in order from right to left, the emission spectra obtained from the first pixel 102b, the second pixel 102g, and the third pixel 102r. The first light-emitting element 104b in the first pixel 102b has a resonance structure suitable for amplification of light with a short wavelength compared with the second light-emitting element 104g and the third light-emitting element 104r. Hence, the resonance structure can be configured so that light in a blue region (e.g., around 450 nm) is amplified and light with a wavelength apart from this region is attenuated. Accordingly, the emission in a region other than the blue region is attenuated, and blue emission can be mainly obtained from the first pixel 102b as shown in the right diagram in FIG. 4B.

In contrast, it is possible to construct, in the third light-emitting element 104r in the third pixel 102r, a resonance structure suitable for amplification of light with a long wavelength compared with the first light-emitting element 104b and the second light-emitting element 104g as described in the First Embodiment. In this case, light in a red region (e.g., around 750 nm) is amplified, and light of a wavelength apart from this region is attenuated. Accordingly, the emission in a region other than the red region is attenuated, and red emission can be mainly obtained from the third pixel 102r as shown in the left diagram in FIG. 4B.

On the other hand, a resonance structure suitable for amplification of light with a middle wavelength can be provided to the second light-emitting element 104g in the second pixel 102g. Therefore, light in a green region (e.g., around 530 nm) is amplified, and light of a wavelength apart from this region is attenuated. Accordingly, the emission in a region other than the green region is attenuated, and green emission can be mainly obtained from the second pixel 102g as shown in the center diagram in FIG. 4B.

As described above, an arbitrary color can be extracted from the pixels 102 having the white-emissive light-emitting elements even if a color filter is not provided in the embodiment of the present invention. Therefore, a color filter is not necessary, and it is not necessary to form different emission layers 118 between the pixels 102, which enables production of a display device at a low cost.

Third Embodiment

In the present embodiment, display devices 160 and 170 are explained which not only possess the resonance structures over the light-emitting elements but also have the light-emitting elements 104 including optimized resonance structures. An explanation regarding the structures the same as those of the First and Second Embodiments may be omitted.

Figure 5:
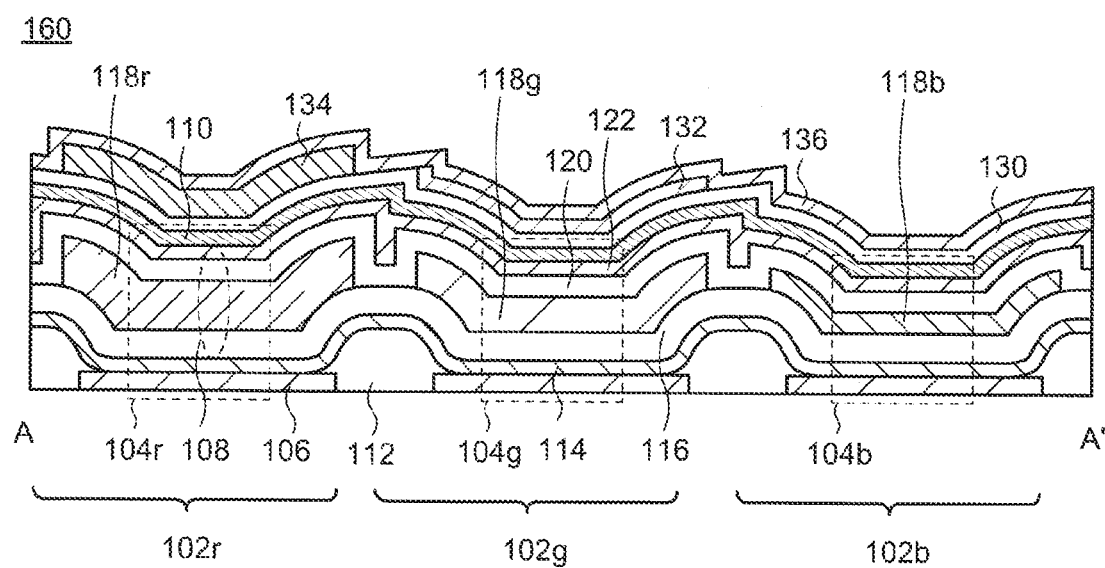

A schematic cross-sectional view of the display device 160 is shown in FIG. 5. The display device 160 is different from the display device 100 in that the thicknesses of the emission layers 118 are different between the first light-emitting element 104b, the second light-emitting element 104g, and the third light-emitting element 104r by which the optimized resonance structure is formed in each light-emitting element 104.

Figures 6A, 6B, 6C:
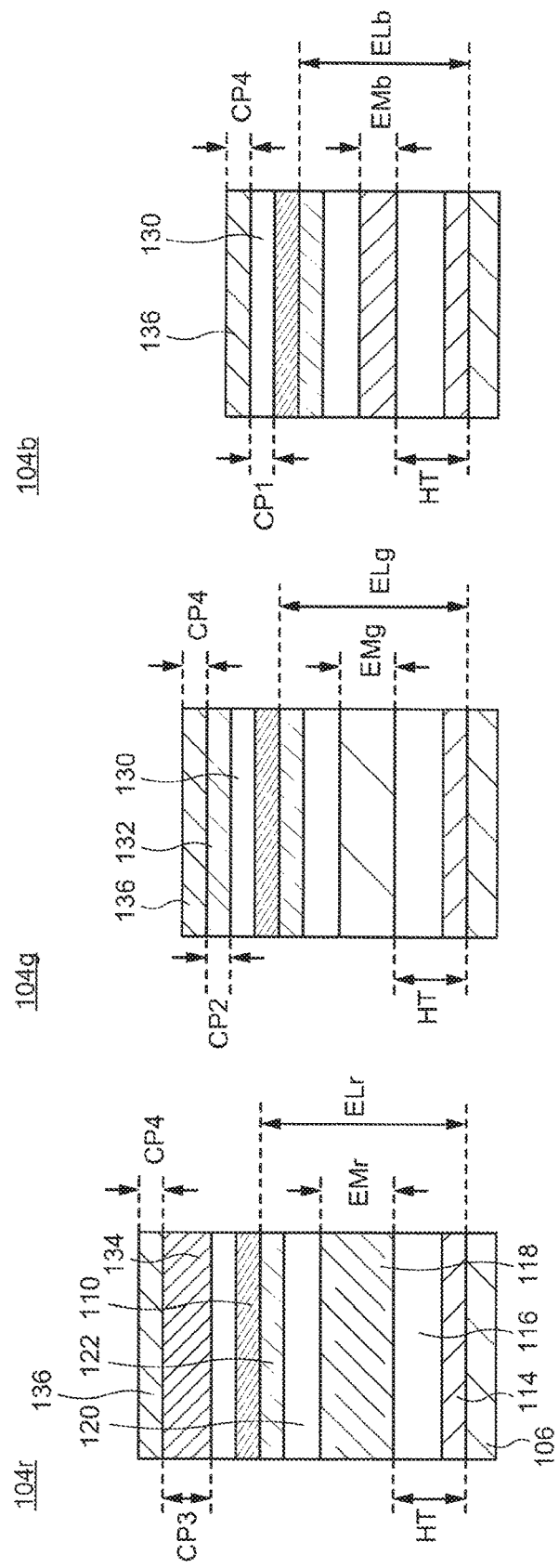
FIG. 6A to FIG. 6C are schematic cross-sectional views of a display device according to an embodiment of the present invention.

The detailed structure of the display device 160 is shown in FIG. 6A to FIG. 6C. FIG. 6A, FIG. 6B, and FIG. 6C are schematic cross-sectional views of the third light-emitting element 104r, the second light-emitting element 104g, and the first light-emitting element 104b, respectively.

In the display device 160, the first electrode 106 is also configured to reflect visible light, and the second electrode 110 is configured to partly transmit and partly reflect visible light. Thus, light radiated from the light-emitting layer 118 is reflected at the top surface of the first electrode 106 (an interface between the first electrode 106 and the hole-injection layer 114) and the bottom surface of the second electrode 110 (an interface between the second electrode 110 and the electron-injection layer 122) and resonates. The interference effect obtained by this resonance is determined by the optical distance between the top surface of the first electrode 106 and the bottom surface of the second electrode 110 and the emission spectrum from the emission layer 118. The optical distance is a summation of a product of a refractive index and a thickness of each layer in the EL layer 108. Therefore, the emission layer 118 is adjusted to strengthen the emission. That is, the emission layer 118 is adjusted so that the optical distance is consistent with an odd multiple of one fourth of $\lambda$ ($\lambda/4$) of the wavelength of the target emission, by which the emission intensity is increased and the emission spectra can be narrowed.

In the display device 160, the optical distance is adjusted by changing the thickness of the emission layer 118 as shown in FIG. 5. Here, the thicknesses of the emission layer 118b, the emission layer 118g, and the emission layer 118r are represented by Emb, Emg, and Emr, respectively. The structures of the hole-transporting region and the electron-transporting region are common in each of the light-emitting elements 104, and the thickness of the former is represented by HT. Furthermore, the thicknesses of the EL layers 108 of the first light-emitting element 104b, the second light-emitting element 104g, and the third light-emitting element 104r are represented by ELb, ELg, and ELr.

When the first light-emitting element 104b is optimized, the thickness of the emission layer 118b is adjusted so that the thickness ELb of the EL layer 108 is an odd multiple of one fourth of $\lambda_b$ ($\lambda_b/4$) where the emission wavelength of the emission layer 118b is $\lambda_b$. On the other hand, since the emission wavelength of the emission layer 118g is longer than the emission wavelength of the emission layer 118b and shorter than the emission wavelength of the emission layer 118r, the thickness Emg of the emission layer 118g is adjusted so as to be more than the thickness Emb of the emission layer 118b and equal to or less than the thickness of the emission layer 118r. Such adjustment allows the thicknesses of the EL layers 108 to be different between the light-emitting elements 104 and the thickness ELg of the EL layer 108 of the second light-emitting element 104g to be larger than the thickness ELb of the EL layer 108 of the first light-emitting element 104b and equal to or less than the thickness ELr of the EL layer 108 of the third light-emitting element 104r.

Additionally, amplification of the emission can be more effectively carried out by configuring each of the light-emitting elements 104 so that the thickness Emb of the emission layer 118b is smaller than the thickness CP1 of the first cap layer 130, the thickness Emg of the emission layer 118g is smaller than a summation of the thickness CP1 of the first cap layer 130 and the thickness CP2 of the second cap layer 132, and the thickness Emr of the emission layer 118r is smaller than a summation of the thickness CP1 of the first cap layer 130 and the thickness CP3 of the third cap layer 134.

Figure 7:
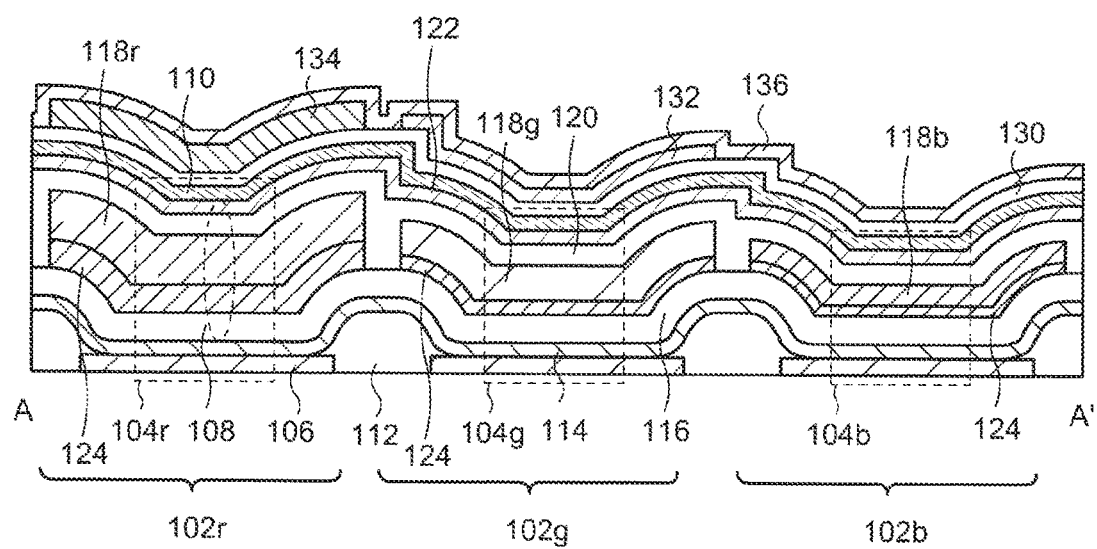

In the display device 170, the thicknesses HT of the hole-transporting regions are different between the pixels 102. As shown in FIG. 7, for example, the thickness HT of the hole-transporting region and the thickness of the EL layer 108 are adjusted by forming an electron-blocking layer 124 between the emission layer 118 and the hole-transporting layer 116 of the light-emitting element 104 in each pixel 102. Note that the thickness HT of the hole-transporting region may be controlled by adjusting the thickness of the hole-transporting layer 116 without forming the electron blocking layer.

Figure 8A:
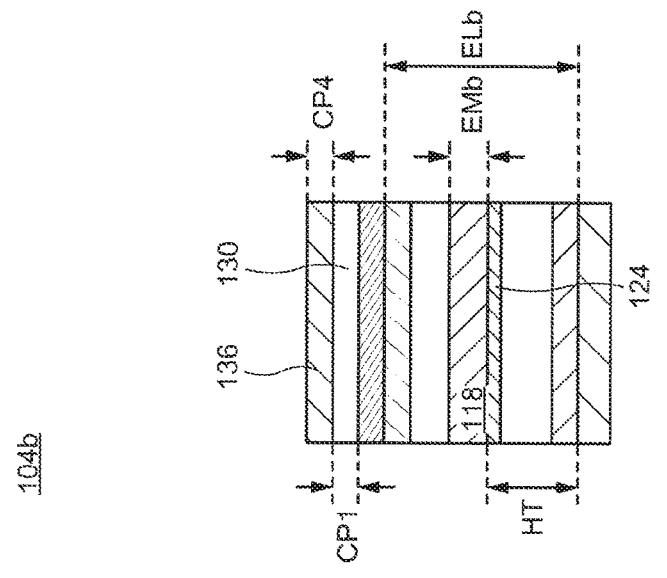
FIG. 8A to FIG. 8C are schematic cross-sectional views of a display device according to an embodiment of the present invention.
Figure 8B:
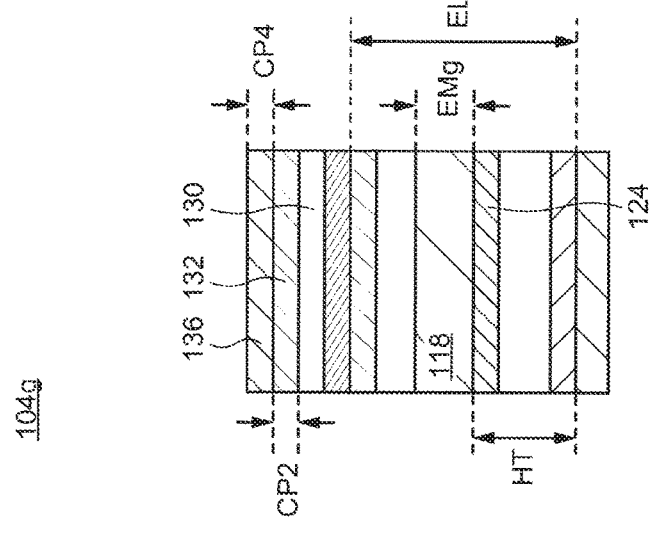
Figure 8C:
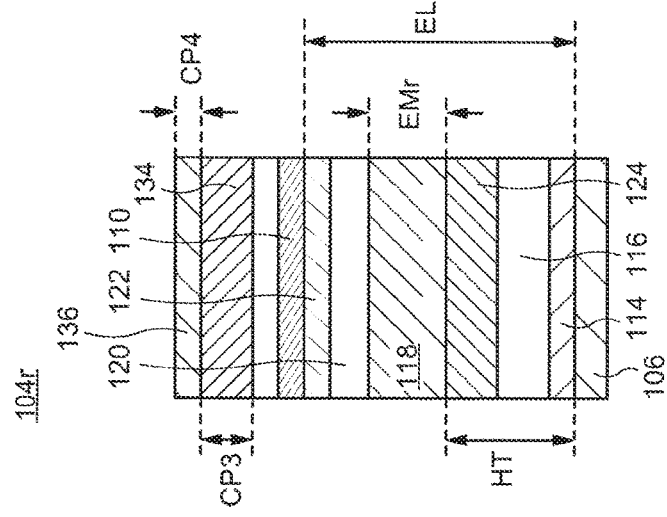

Specifically, as shown in FIG. 8A, FIG. 8B, and FIG. 8C, the thicknesses of the electron-blocking layer 124 and the emission layer 118 are controlled so that the thickness HT of the hole-transporting region of the second light-emitting element 104g is larger than that of the first light-emitting element 104b and smaller than that of the third light-emitting element 104r. In addition, the thicknesses of the electron-blocking layer 124 and the emission layer 118 are controlled so that the thickness ELg of the EL layer 108 of the second light-emitting element 104g is larger than the thickness ELb of the EL layer 108 of the first light-emitting element 104b and smaller than the thickness ELr of the EL layer 108 of the third light-emitting element 104r. With this structure, it is possible to more effectively amplify the light emission and narrow the spectrum in each light-emitting element 104. The light emission which is amplified and whose spectrum is narrowed in such a manner can be further optically adjusted with the resonance structure over each light-emitting element 104. Therefore, a more precisely optimized resonance structure can be constructed in every light-emitting element 104, which allows production of a display device having high color reproducibility and high efficiency.

The first cap layer 130 and the fourth cap layer 136 can also be commonly disposed across the plurality of pixels in the display devices 160 and 170. The use of a fine metal mask can be avoided by employing this structure when the first cap layer 130 and the fourth cap layer 136 are formed with an evaporation method, by which the number of evaporative depositions using a fine metal mask can be reduced. As a result, a display device with improved reliability can be manufactured at a high yield.

Fourth Embodiment

In the present embodiment, a display device 180 having a structure different from those of the display devices 100, 140, 140, 160, and 170 shown in the First to Third Embodiments is explained. An explanation of the structures the same as those of the First to Third Embodiments may be omitted.

Figure 9:
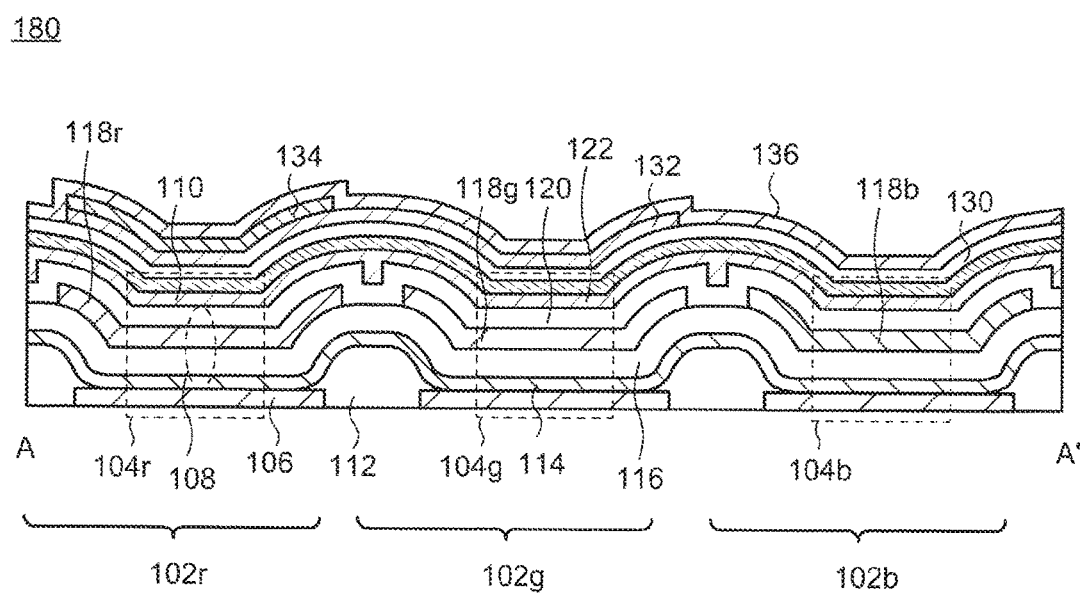

As shown in FIG. 9, the display device 180 is different from the display devices shown in other Embodiments in that the second cap layer 132 extends to the third pixel 102r from the second pixel 102g and is shared by the second pixel 102g and the third pixel 102r. Therefore, the second cap layer 132 overlaps with the third pixel 102r and is sandwiched by the first cap layer 130 and the third cap layer 134 in the third pixel 102r. In the display device 180, the thickness of the third cap layer 143 may be smaller than, larger than, or the same as the thickness of the second cap layer 132.

Similar to the display devices shown in the First to Third Embodiments, the number of evaporative depositions using a fine metal mask can be reduced when the display device 180 is manufactured, which enables production of a display device with improved reliability at a high yield. Moreover, a more precisely optimized resonance structure can be constructed in every light-emitting element 104, which allows production of a display device having high color reproducibility and high efficiency.

Fifth Embodiment

In the present embodiment, a manufacturing method of the display device 100 is explained. An explanation of the structures the same as those of the First to Fourth Embodiments may be omitted.

FIG. 10 is a schematic perspective view of the display device 100. The display device 100 possesses, over a substrate 200, a plurality of pixels 102 arranged in a row direction and a column direction, a display region 204 structured by the plurality of pixels 102, scanning-line driver circuits 206, and a data-line driver circuit 208. An opposing substrate 202 covers the display region 204. A variety of signals from an external circuit (not shown) is input to the scanning-line driver circuits 206 and the data-line driver circuit 208 through a connector such as a flexible printed circuit (FPC) connected to terminals 210 formed over the substrate 200, and each pixel 102 is controlled on the basis of these signals.

One or all of the scanning-line driver circuits 206 and the data-line driver circuit 208 may not be necessarily formed directly over the substrate 200. A driver circuit formed over a substrate (e.g., semiconductor substrate) different from the substrate 200 may be mounted on the substrate 200 or the connector, and each pixel 102 may be controlled with the driver circuit. In FIG. 10, an example is shown where the scanning-line driver circuits 206 prepared over the substrate 200 are covered by the opposing substrate 202, while the data-line driver circuit 208 is prepared over another substrate and then mounted on the substrate 200.

The substrate 200 and the opposing substrate 202 may be a substrate without flexibility, such as a glass substrate, or a substrate having flexibility. A structure may be employed in which a resin film or an optical film such as a circular polarizing plate is bonded instead of the opposing substrate 202. The pixels 102 are arranged in a matrix form. However, the arrangement is not limited, and a stripe arrangement, a delta arrangement, and the like may be applied.

Figure 11:
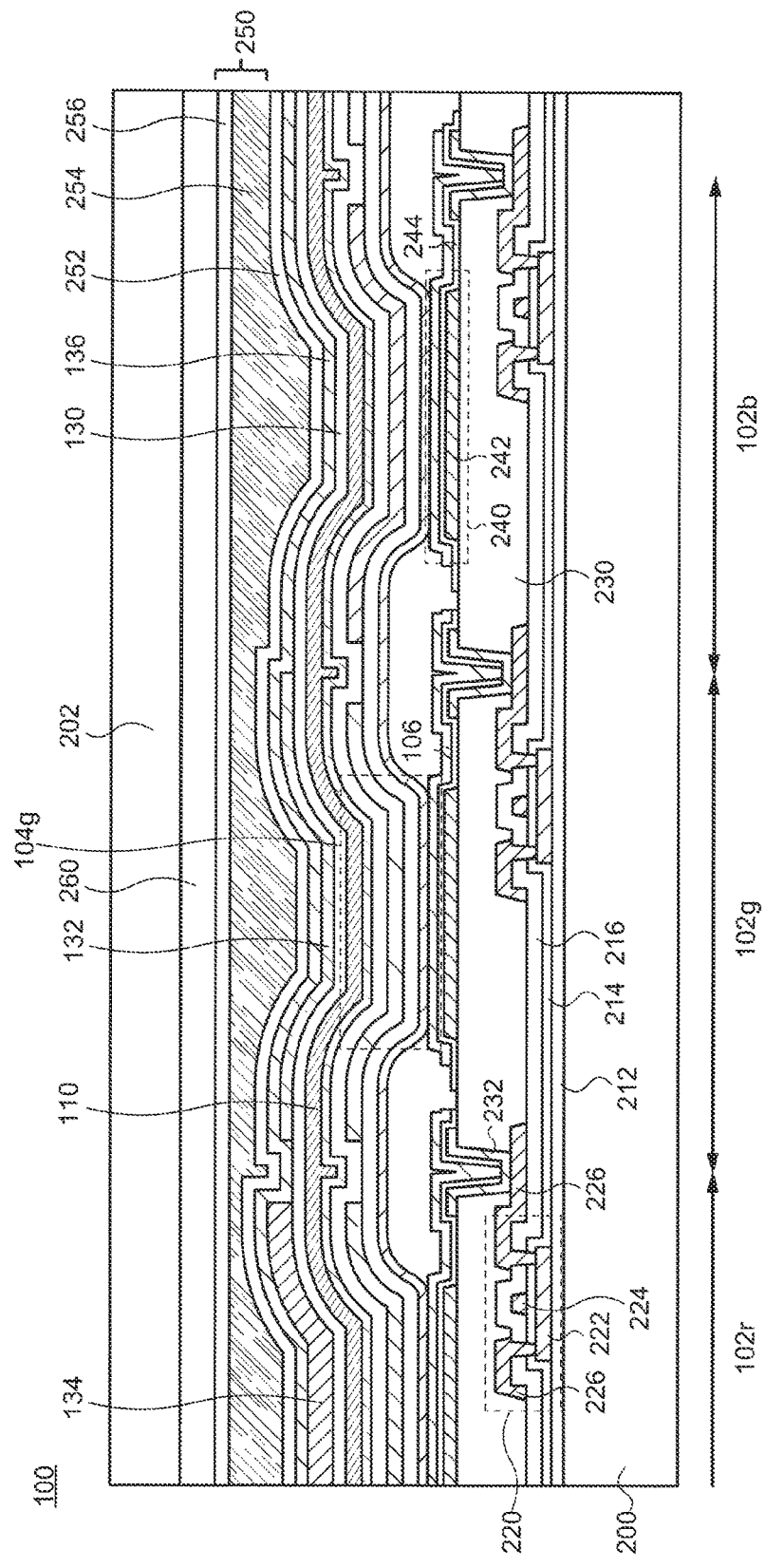
FIG. 11 is a schematic cross-sectional view of a display device according to an embodiment of the present invention.

FIG. 11 shows a schematic cross-sectional view of the display device 100 including the first pixel 102b, the second pixel 102g, and the third pixel 102r. The first pixel 102b, the second pixel 102g, and the third pixel 102r each possess, over the substrate 200, elements such as a transistor 220, the light-emitting element 104 electrically connected to the transistor 220, and a supplementary capacitor 240 through a base film 212. FIG. 11 shows an example in which one transistor 220 and one supplementary capacitor 240 are disposed in each pixel 102. However, each pixel 102 may have a plurality of transistors and a plurality of capacitor elements. The structure of the light-emitting element 104 is the same as that described in the First Embodiment. Hereinafter, the manufacturing method of the display device 100 is explained.

1. Transistor

First, as shown in FIG. 12A, the base film 212 is formed over the substrate 200. The substrate 200 has a function to support semiconductor elements included in the display region 204, such as the transistor 220, the light-emitting element 104, and the like. Therefore, a material having heat resistance to a process temperature of a variety of elements formed thereover and chemical stability to chemicals used in the process may be used for the substrate 200. Specifically, the substrate 200 may include glass, quartz, plastics, a metal, ceramics, and the like.

When flexibility is provided to the display device 100, a base material (not illustrated) is formed over the substrate 200, and then the base film 212 is provided. In this case, the substrate 200 may be called a supporting substrate or a carrier substrate. The base material is an insulating film with flexibility and may include a material selected from polymer materials exemplified by a polyimide, a polyamide, a polyester, and a polycarbonate. The base material can be formed by applying a wet-type film-forming method such as a printing method, an ink-jet method, a spin-coating method, and a dip-coating method or a lamination method.

The base film 212 is a film having a function to prevent impurities such as an alkaline metal from diffusing to the transistor 220 and the like from the substrate 200 (and the base material) and may include a silicon-containing inorganic compound such as silicon nitride, silicon oxide, silicon nitride oxide, and silicon oxynitride. The base film 212 can be formed to have a single-layer or stacked-layer structure by applying a chemical vapor deposition method (CVD method), a sputtering method, or the like.

Next, a semiconductor film 222 is formed (FIG. 12A). The semiconductor film 222 may contain Group 14 elements such as silicon. Alternatively, the semiconductor film 222 may include an oxide semiconductor. As an oxide semiconductor, Group 13 elements such as indium and gallium are represented. For example, a mixed oxide (IGO) of indium and gallium may be used. When an oxide semiconductor is used, the semiconductor film 222 may further contain a Group 12 element, and a mixed oxide (IGZO) of indium, gallium, and zinc is exemplified. Crystallinity of the semiconductor film 222 is not limited, and the semiconductor film 222 may include a crystal state of a single crystalline, polycrystalline, microcrystalline, or amorphous state.

When the semiconductor film 222 includes silicon, the semiconductor film 222 may be prepared with a CVD method by using a silane gas and the like as a raw material. A heat treatment or application of light such as a laser may be performed on amorphous silicon obtained to conduct crystallization. When the semiconductor film 222 includes an oxide semiconductor, the semiconductor film 222 can be formed by utilizing a sputtering method and the like.

Next, a gate insulating film 214 is prepared so as to cover the semiconductor film 222 (FIG. 12A). The gate insulating film 214 may also include a silicon-containing inorganic compound and can be prepared with a CVD method or a sputtering method. The gate insulating film 214 may have a single-layer structure or a stacked-layer structure.

Next, a gate 224 is formed over the gate insulating film 214 with a sputtering method or a CVD method (FIG. 12B). The gate 224 may be formed with a metal such as titanium, aluminum, copper, molybdenum, tungsten, tantalum or an alloy thereof so as to have a single-layer or stacked-layer structure. For example, a structure in which a highly conductive metal such as aluminum and copper is sandwiched by a metal with a relatively high melting point, such as titanium, tungsten, and molybdenum, can be employed.

Next, an interlayer film 216 is formed over the gate 224 (FIG. 12B). The interlayer film 216 may have a single-layer or stacked layer structure, may include a silicon-containing inorganic compound and may be prepared with a CVD method or a sputtering method. When the interlayer film 216 has a stacked structure, a layer including an inorganic compound may be stacked after forming a layer including an organic compound, for example. Although a detailed explanation is omitted, doping may be conducted on the semiconductor film 222 to form source/drain regions, a low-concentration impurity region, and the like.

Next, etching is performed on the interlayer film 216 and the gate insulating film 214 to form openings 228 reaching the semiconductor film 222 (FIG. 12C). The openings 228 can be prepared, for example, by conducting plasma etching in a gas including a fluorine-containing hydrocarbon.

Figure 13A:
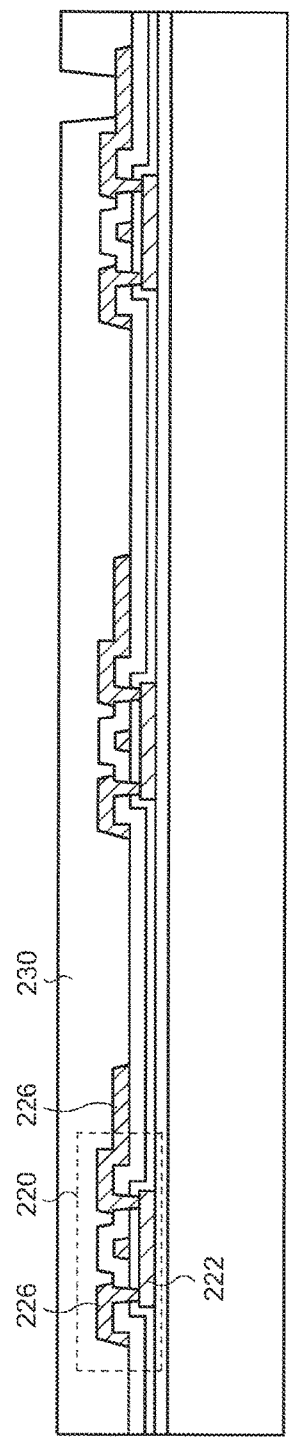
FIG. 13A to FIG. 13C are schematic cross-sectional views for explaining a manufacturing method of a display device according to an embodiment of the present invention.

Next, a metal film is formed to cover the openings 228 and processed with etching to form a source/drain 226 (FIG. 13A). Similar to the gate 224, the metal film may include a variety of metals and have a single-layer or stacked layer structure. Through the aforementioned processes, the transistor 220 is fabricated. In the present embodiment, the transistor 220 is illustrated as a top-gate type transistor. However, there is no limitation to the structure of the transistor 220, and the transistor 220 may be a bottom-gate type transistor, a multi-gate type transistor having a plurality of gates 224, or a dual-gate type transistor having a structure in which the semiconductor film 222 is sandwiched by two gates 224. Moreover, there is no limitation to a vertical relationship between the source/drain 226 and the semiconductor film 222.

2. Supplementary Capacitor and Light-Emitting Element

Next, a leveling film 230 is formed so as to cover the transistor 220 (FIG. 13A). The leveling film 230 has a function to absorb depressions, projections, and inclinations caused by the transistor 220 and the like and provide a flat surface. The leveling film 230 can be prepared with an organic insulator. As an organic insulator, a polymer material such as an epoxy resin, an acrylic resin, a polyimide, a polyamide, a polyester, a polycarbonate, and a polysiloxane is represented. The leveling film 230 can be formed with the aforementioned wet-type film-forming method and the like.

Figure 13B:
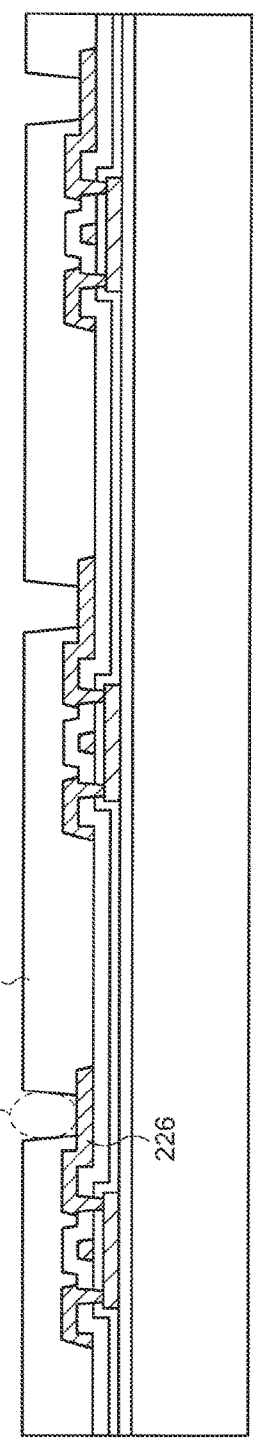
Figure 13C:
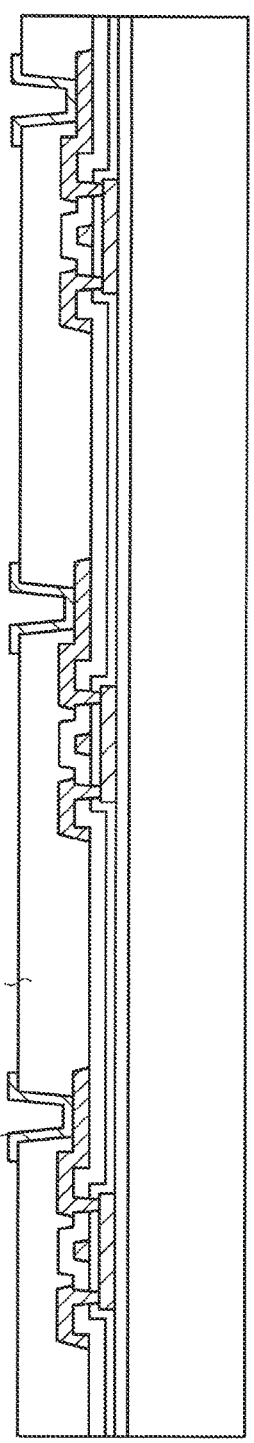

After that, etching is performed on the leveling film 230 to form an opening 234 exposing one of the source/drain 226 of the transistor 220 (FIG. 13B). A connection electrode 232 is prepared so as to cover this opening 234 and be in contact with one of the source/drain 226 of the transistor 220 (FIG. 13C). The connection electrode 232 may be formed by using a conductive oxide such as ITO and IZO with a sputtering method or the like. Formation of the connection electrode 232 is optional. Deterioration of a surface of the source/drain 226 can be avoided in the following processes by forming the connection electrode 232, by which generation of contact resistance between the source/drain 226 and the first electrode 106 can be suppressed.

Figure 14A:
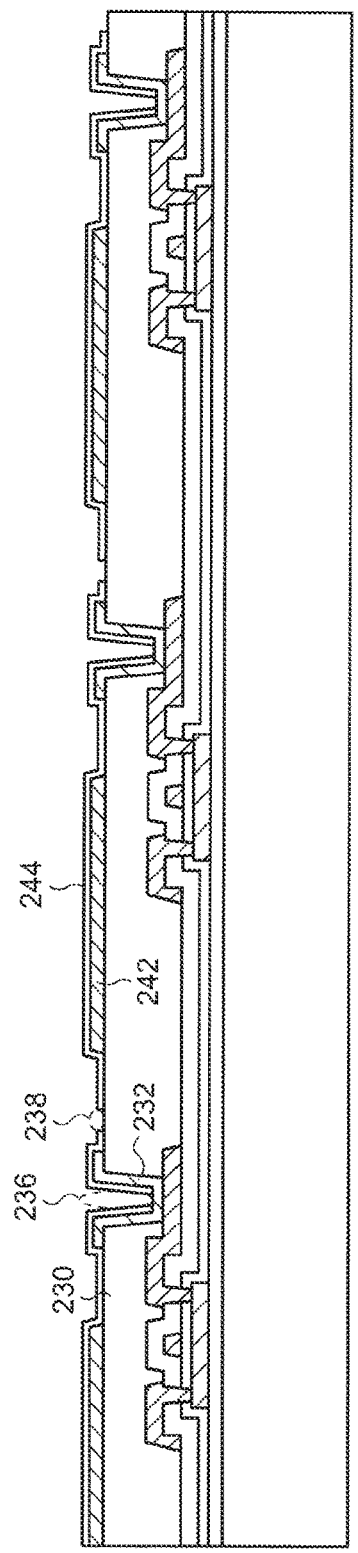
FIG. 14A and FIG. 14B are schematic cross-sectional views for explaining a manufacturing method of a display device according to an embodiment of the present invention.

Next, a metal film is formed over the leveling film 230 and processed with etching to form one of the electrodes 242 of the supplementary capacitor 240 (FIG. 14A). Similar to the conductive film used for the formation of the source/drain 226, the metal film used here may have a single layer structure or a stacked layer structure, and a three-layer structure of molybdenum/aluminum/molybdenum may be employed, for example.

Next, an insulating film 244 is formed over the leveling film 230 and the electrode 242 (FIG. 14A). The insulating film 244 not only functions as a protection film for the transistor 220 but also serves as a dielectric in the supplementary capacitor 240. Therefore, it is preferred to use a material with relatively high permittivity. The insulating film 244 may include a silicon-containing inorganic compound and may be formed by applying a CVD method or a sputtering method. After that, openings 236 and 238 are provided in the insulating film 244 (FIG. 14A). The former exposes a bottom surface of the connection electrode 232 to provide electrical connection between the first electrode 106 formed later and the connection electrode 232. The latter is an opening to abstract, through the partition wall 112, water and gas eliminated from the leveling film 230 in a heating process and the like performed after the formation of the partition wall 112.

Figure 14B:
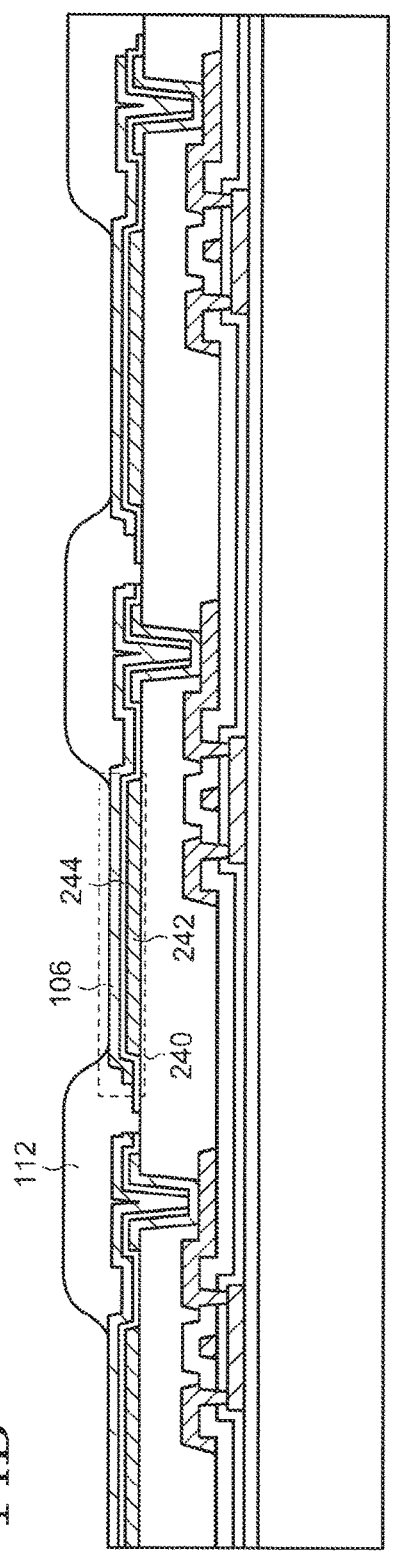

Next, as shown in FIG. 14B, the first electrode 106 is formed so as to cover the opening 236. The supplementary capacitor 240 is formed by the first electrode 106, the insulating film 244, and the electrode 242. A potential of the gate 224 of the transistor 220 can be maintained for a longer time by forming the supplementary capacitor 240. The structure of the first electrode 106 is the same as that described in the First Embodiment, and the first electrode 106 can be formed by using a sputtering method, a CVD method, or the like.

Next, the partition wall 112 is formed so as to cover an edge portion of the first electrode 106 (FIG. 14B). The partition wall 112 may be prepared with a wet-type film-forming method by using an epoxy resin, an acrylic resin, or the like.

Figure 15A:
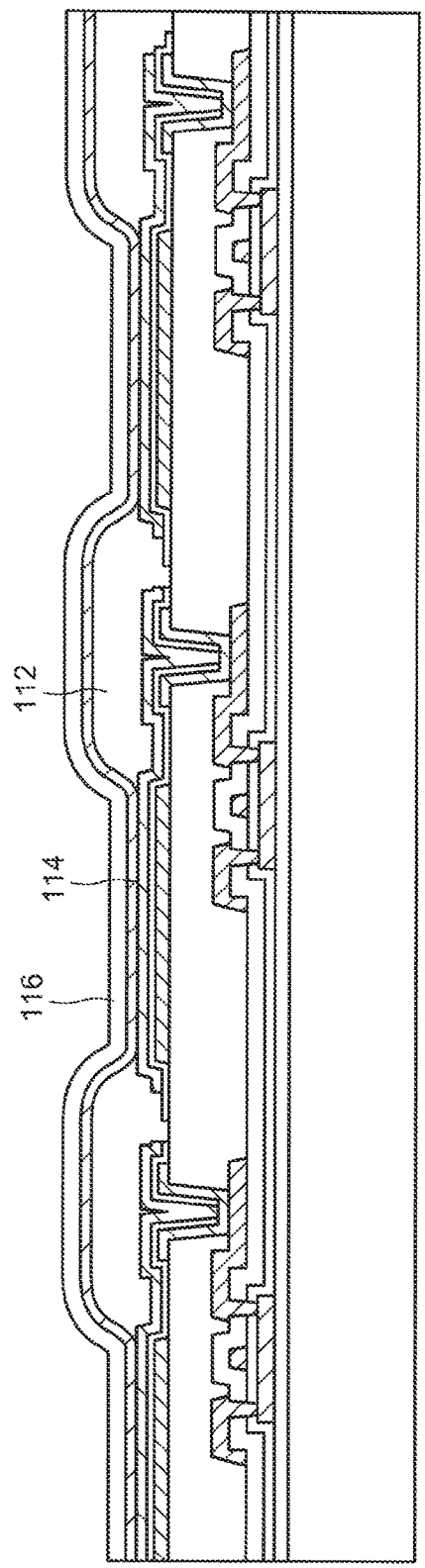
FIG. 15A and FIG. 15B are schematic cross-sectional views for explaining a manufacturing method of a display device according to an embodiment of the present invention.
Figure 15B:
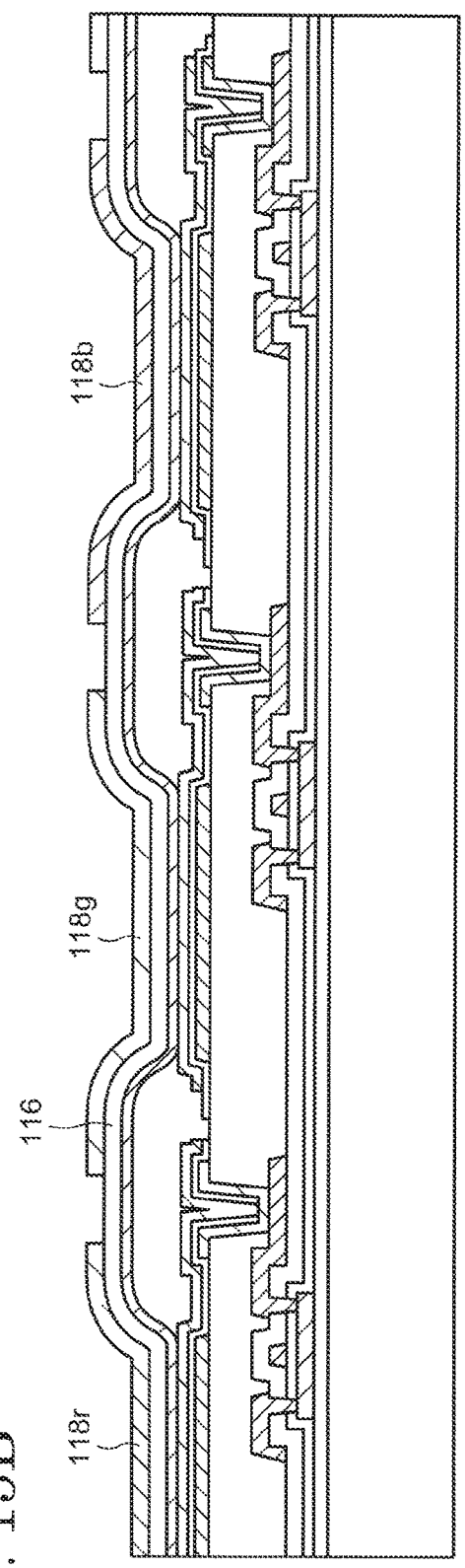

Next, the EL layer 108 and the second electrode 110 are formed so as to cover the first electrode 106 and the partition wall 112. The structures of these elements are the same as those described in the First Embodiment. Specifically, the hole-injection layer 114 is first formed to cover the first electrode 106 and the partition wall 112, and then the hole-transporting layer 116 is prepared over the hole-injection layer 114 (FIG. 15A). After that, the emission layers 118 are formed over the hole-transporting layer 116 (FIG. 15B). In the present embodiment, the emission layers 118 having different structures or including different materials between the adjacent pixels 102 are formed. In this case, the materials to be included in the emission layers 118b, 118g, and 118r respectively corresponding to the first pixel 102b, the second pixel 102g, and the third pixel 102r are sequentially deposited with an evaporation method. Alternatively, the emission layers 118b, 118g, and 118r may be formed with an ink-jet method.

The electron-transporting layer 120 and the electron-injection layer 122 are successively formed over the emission layer 118, and the second electrode 110 is fabricated over the electron-injection layer 122 (FIG. 16A). Each layer structuring the EL layer 108 may be formed by applying a wet-type film-forming method or a dry-type film-forming method such as an evaporation method. The second electrode 110 is also prepared by using a sputtering method or an evaporation method. Through these processes, the supplementary capacitor 240 and the light-emitting element 104 are fabricated.

3. Cap Layer

Next, the first cap layer 130 is formed over the second electrode 110 (FIG. 16B). The first cap layer 130 may be formed with a wet-type film-forming method or a dry-type film-forming method. When the first cap layer 130 is prepared with an evaporation method, the evaporation may be carried out by using a metal mask. In this case, it is possible to use a metal mask having a relatively large opening portion corresponding to the shape of the display region 204. Therefore, highly accurate mask alignment is not required, enabling efficient formation of the first cap layer 130.

Next, the second cap layer 132 and the third cap layer 134 respectively overlapping with the second pixel 102g and the third pixel 102r are formed over the first cap layer 130 (FIG. 17A and FIG. 17B). The formation order of the second cap layer 132 and the third cap layer 134 may be arbitrarily determined. The second cap layer 132 and the third cap layer 134 may be formed with the same method as the first cap layer 130. When an evaporation method is applied, a metal mask having opening portions corresponding to the respective pixels 102 may be used. The third cap layer 134 is formed so as to have a larger thickness than the second cap layer 132.

Figure 18:
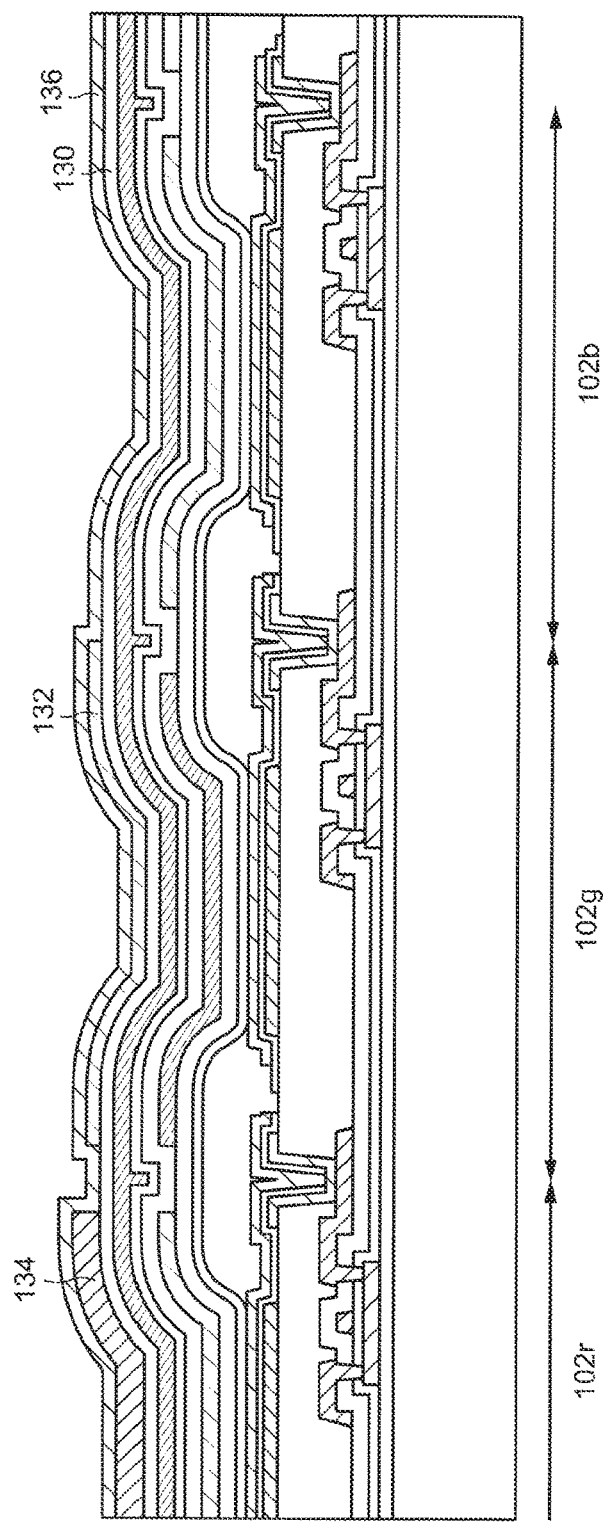
FIG. 18 is a schematic cross-sectional view for explaining a manufacturing method of a display device according to an embodiment of the present invention.

After that, the fourth cap layer 136 is formed to cover the first cap layer 130, the second cap layer 132, and the third cap layer 134 (FIG. 18). The fourth cap layer 136 can also be prepared by applying a dry-type film-formation method such as an evaporation method. Similar to the formation of the first cap layer 130, the fourth cap layer 136 may be formed with an evaporation method using a metal mask having a relatively large opening portion corresponding to the shape of the display region 204.

4. Other Structures

Figure 19:
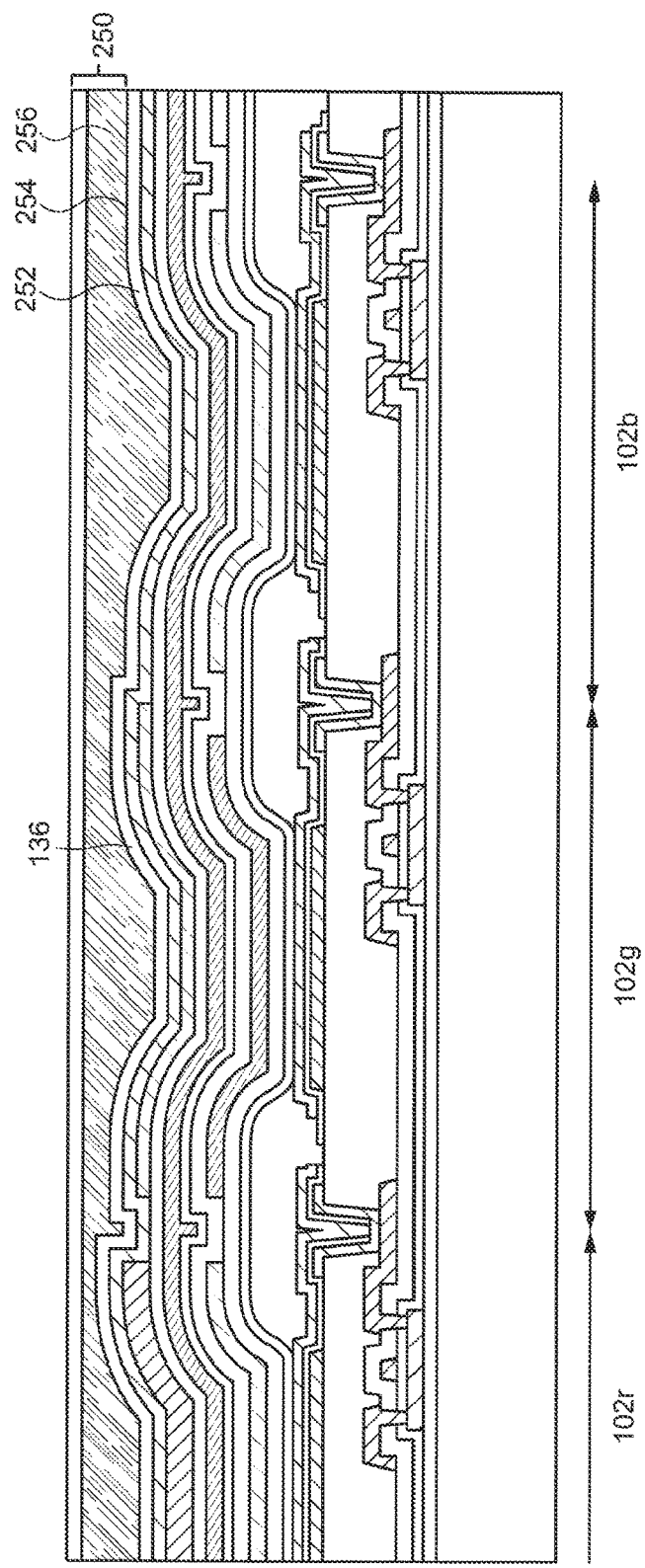
FIG. 19 is a schematic cross-sectional view for explaining a manufacturing method of a display device according to an embodiment of the present invention.

The display device 100 may having a passivation film (sealing film) and the like as an optional structure. For example, a passivation film 250 in which a first layer 252, a second layer 254, and a third layer 256 are stacked may be formed as shown in FIG. 19.

In this case, the first layer 252 is first formed over the fourth cap layer 136. The first layer 252 may include a silicon-containing inorganic compound or the like and may be prepared with a CVD method or a sputtering method, for example.

Next, the second layer 254 is formed. The second layer 254 may contain an organic resin including an acrylic resin, a polysiloxane, a polyimide, a polyester, and the like. Furthermore, as shown in FIG. 19, the second layer 254 may be formed at a thickness so that depressions and projections caused by the partition wall 112 and the like are absorbed and a flat surface is provided. The second layer 254 may be formed by a wet-type film-forming method such as an ink-jet method. Alternatively, the second layer 254 may be prepared by atomizing or vaporizing oligomers serving as a raw material of the aforementioned polymer material at a reduced pressure, spraying the first layer 252 with the oligomers, and then polymerizing the oligomers.

After that, the third layer 256 is formed. The third layer 256 may have the same structure as the first layer 252 and can be formed with the same method as that of the first layer 252. Through these processes, the passivation film 250 is fabricated.

After that, the opposing substrate 202 is fixed through the filler 260 (FIG. 11). The filler 260 may contain a polymer material such as a polyester, an epoxy resin, an acrylic resin, and a novolak resin and may be formed by applying a printing method, a lamination method or the like. A desiccant may be included in the filler 260. The opposing substrate 202 may include the same material as the substrate 200. When flexibility is provided to the display device 100, a polymer material such as a polyolefin and a polyimide can be applied for the opposing substrate 202 in addition to the aforementioned polymer materials. In this case, the elements such as the transistor 220 and the light-emitting element 104 are fabricated over a base material formed over the substrate 200 as described above, and then the opposing substrate 202 with flexibility is fixed thereover with an adhesive. After that, an interface between the substrate 200 and the base material is irradiated with light such as a laser to reduce adhesion between the substrate 200 and the base material, and then the substrate 200 is physically peeled off, leading to the formation of the flexible display device 100.

Although not shown, a polarizing plate (circular polarizing plate) may be formed instead of the opposing substrate 202 as described above. Alternatively, a polarizing plate may be arranged over or under the opposing substrate 202.

As described above, when a resonance structure is formed in accordance with the color provided by each pixel 102, it is necessary to fabricate resonance structures with different thicknesses to the respective pixels 104, which requires conducting evaporative depositions using a fine metal mask three times, for example. Hence, not only the yield of a display device is decreased, but reliability thereof is also decreased.

On the other hand, in an embodiment of the present invention, it is possible to reduce the number of evaporative depositions using a fine metal mask. Therefore, a display device can be manufactured at a high yield, and a display device having high color reproducibility, low power consumption, and high reliability can be produced.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by persons ordinarily skilled in the art.

What is claimed is:

1. A display device comprising:
    a first pixel, a second pixel, and a third pixel comprising a first light-emitting element, a second light-emitting element, and a third light-emitting element, respectively;
    a first cap layer overlapping with the first light-emitting element, the second light-emitting element, and the third light-emitting element, the first cap layer extending from the first pixel to the third pixel through the second pixel;
    a second cap layer over the first cap layer, the second cap layer overlapping with the second light-emitting element;
    a third cap layer over the first cap layer, the third cap layer overlapping with the third light-emitting element; and
    a fourth cap layer over the first cap layer, the second cap layer, and the third cap layer,
    wherein the first pixel, the second pixel, and the third pixel are arranged in this order,
    the first light-emitting element, the second light-emitting element, and the third light-emitting element each comprises:
        a first electrode;
        a hole-transporting region over and in contact with the first electrode;
        an emission layer over and in contact with the hole-transporting region;
        an electron-transporting region over and in contact with the emission layer; and a second electrode over and in contact with the electron-transporting region, the first light-emitting element, the second light-emitting element, and the third light-emitting element are configured so that an emission wavelength of the second light-emitting element is shorter than an emission wavelength of the third light-emitting element and longer than an emission wavelength of the first light-emitting element, and a thickness of the third cap layer is larger than a thickness of the second cap layer.

2. The display device according to claim 1, wherein the first cap layer, the second cap layer, and the third cap layer include the same organic compound.

3. The display device according to claim 1, wherein one of the first cap layer, the second cap layer, and the third cap layer includes an organic compound different from an organic compound included in the other one of the first cap layer, the second cap layer, and the third cap layer.

4. The display device according to claim 1, wherein the fourth cap layer includes an inorganic compound and extends from the first pixel to the third pixel through the second pixel.

5. The display device according to claim 1, wherein a thickness of the fourth cap layer is larger than a thickness of the first cap layer and equal to or less than a summation of the thickness of the first cap layer and the thickness of the second cap layer.

6. The display device according to claim 1, wherein a thickness of the first cap layer is larger than the thickness of the second cap layer and equal to or less than the thickness of the third cap layer.

7. The display device according to claim 1, wherein a thickness of the emission layer of the second light-emitting element is larger than a thickness of the emission layer of the first light-emitting element and equal to or less than a thickness of the emission layer of the third light-emitting element.

8. The display device according to claim 7,
wherein a thickness of the first cap layer is larger than the thickness of the emission layer of the first light-emitting element,
a summation of the thickness of the first cap layer and the thickness of the second cap layer is larger than the thickness of the emission layer of the second light-emitting element, and
a summation of the thickness of the first cap layer and the thickness of the third cap layer is larger than the thickness of the emission layer of the third light-emitting element.

9. The display device according to claim 1, wherein a distance between an upper surface of the first electrode and a bottom surface of the second electrode in the second light-emitting element is larger than that in the first light-emitting element and smaller than that in the third light-emitting element.

10. The display device according to claim 1, wherein a thickness of the hole-transporting region of the second light-emitting element is larger than that of the first light-emitting element and smaller than that of the third light-emitting element.

11. A display device comprising:
a first pixel, a second pixel, and a third pixel comprising a first light-emitting element, a second light-emitting element, and a third light-emitting element, respectively;

a first cap layer overlapping with the first light-emitting element, the second light-emitting element, and the third light-emitting element and extending from the first pixel to the third pixel through the second pixel;

a second cap layer over the first cap layer, the second cap layer overlapping with the second light-emitting element and the third light-emitting element and extending from the second pixel to the third pixel;

a third cap layer over the second cap layer, the third cap layer overlapping with the third light-emitting element; and a fourth cap layer over the first cap layer, the second cap layer, and the third cap layer, wherein the first pixel, the second pixel, and the third pixel are arranged in this order, and the first light-emitting element, the second light-emitting element, and the third light-emitting element each comprises:
a first electrode;
a hole-transporting region over and in contact with the first electrode;
an emission layer over and in contact with the hole-transporting region;
an electron-transporting region over and in contact with the emission layer; and
a second electrode over and in contact with the electron-transporting region.

12. The display device according to claim 11, wherein the first cap layer, the second cap layer, and the third cap layer include the same organic compound.

13. The display device according to claim 11, wherein one of the first cap layer, the second cap layer, and the third cap layer includes an organic compound different from an organic compound included in the other one of the first cap layer, the second cap layer, and the third cap layer.

14. The display device according to claim 11, wherein the fourth cap layer includes an inorganic compound and extends from the first pixel to the third pixel through the second pixel.

15. The display device according to claim 11, wherein a thickness of the fourth cap layer is larger than a thickness of the first cap layer and equal to or less than a summation of the thickness of the first cap layer and a thickness of the second cap layer.

16. The display device according to claim 11, wherein a thickness of the first cap layer is larger than a thickness of the second cap layer and equal to or less than a summation of the thickness of the second cap layer and a thickness of the third cap layer.

17. The display device according to claim 11, wherein a thickness of the emission layer of the second light-emitting element is larger than a thickness of the emission layer of the first light-emitting element and equal to or less than a thickness of the emission layer of the third light-emitting element.

18. The display device according to claim 17,
wherein a thickness of the first cap layer is larger than the thickness of the emission layer of the first light-emitting element,
a summation of the thickness of the first cap layer and a thickness of the second cap layer is larger than the thickness of the emission layer of the second light-emitting element, and
a summation of the thickness of the first cap layer, the thickness of the second cap layer, and a thickness of the third cap layer is larger than the thickness of the emission layer of the third light-emitting element.

19. The display device according to claim 11, wherein a distance between an upper surface of the first electrode and a bottom surface of the second electrode in the second light-emitting element is larger than that in the first light-emitting element and smaller than that in the third light-emitting element.

20. The display device according to claim 11, wherein a thickness of the hole-transporting region of the second light-emitting element is larger than that of the first light-emitting element and smaller than that of the third light-emitting element.

* * * * *